(12) United States Patent
Kirimura

(10) Patent No.: US 8,466,518 B2
(45) Date of Patent: *Jun. 18, 2013

(54) SEMICONDUCTOR DEVICE AND SEMICONDUCTOR DEVICE MANUFACTURING METHOD

(75) Inventor: Tomoyuki Kirimura, Yokohama (JP)

(73) Assignee: Fujitsu Semiconductor Limited, Yokohama (JP)

( * ) Notice: Subject to any disclaimer, the term of this patent is extended or adjusted under 35 U.S.C. 154(b) by 106 days.

This patent is subject to a terminal disclaimer.

(21) Appl. No.: 13/098,881

(22) Filed: May 2, 2011

(65) Prior Publication Data

US 2012/0038000 A1 Feb. 16, 2012

(30) Foreign Application Priority Data

Aug. 10, 2010 (JP) .................................. 2010-179384

(51) Int. Cl.
*H01L 27/092* (2006.01)
*H01L 21/8238* (2006.01)

(52) U.S. Cl.
USPC ............. 257/371; 257/369; 257/E21.575; 257/E27.067; 257/E27.062; 438/586

(58) Field of Classification Search
None
See application file for complete search history.

(56) References Cited

U.S. PATENT DOCUMENTS

| | | | |
|---|---|---|---|
| 8,097,542 B2 * | 1/2012 | Wieczorek et al. | 438/783 |
| 8,362,569 B2 * | 1/2013 | Kirimura et al. | 257/369 |
| 2007/0205467 A1 | 9/2007 | Morioka et al. | |
| 2008/0026487 A1 * | 1/2008 | Feustel et al. | 438/7 |
| 2008/0050869 A1 | 2/2008 | Sudo | |
| 2008/0128831 A1 * | 6/2008 | Chou et al. | 257/401 |
| 2009/0215277 A1 | 8/2009 | Lee et al. | |
| 2009/0218629 A1 * | 9/2009 | Wieczorek et al. | 257/368 |
| 2009/0273035 A1 * | 11/2009 | Frohberg et al. | 257/369 |
| 2010/0270623 A1 * | 10/2010 | Kirimura et al. | 257/369 |

FOREIGN PATENT DOCUMENTS

| | | |
|---|---|---|
| JP | 2007-208166 A | 8/2007 |
| JP | 2007-235074 A | 9/2007 |
| JP | 2008-016853 A | 1/2008 |
| JP | 2008-124133 A | 5/2008 |
| JP | 2009-206467 A | 9/2009 |

* cited by examiner

*Primary Examiner* — Thomas L Dickey
*Assistant Examiner* — Joseph Schoenholtz
(74) *Attorney, Agent, or Firm* — Westerman, Hattori, Daniels & Adrian, LLP

(57) ABSTRACT

A semiconductor device manufacturing method includes forming a first stopper film and a second stopper film over a first stress film; etching, with a first mask covering a first region and with the first stopper film, the second stopper film in a second region while side-etching the second stopper film in a part of the first region near the second region; forming a second stress film whose etching characteristic is different from the second stopper film; etching, with a second mask covering the second region and having an end face located over the second stopper film and with the second stopper film, the second stress film so that a part of the second stress film overlaps a part of the first stress film and a part of the second stopper film; and forming a contact hole down to the gate interconnect.

17 Claims, 12 Drawing Sheets

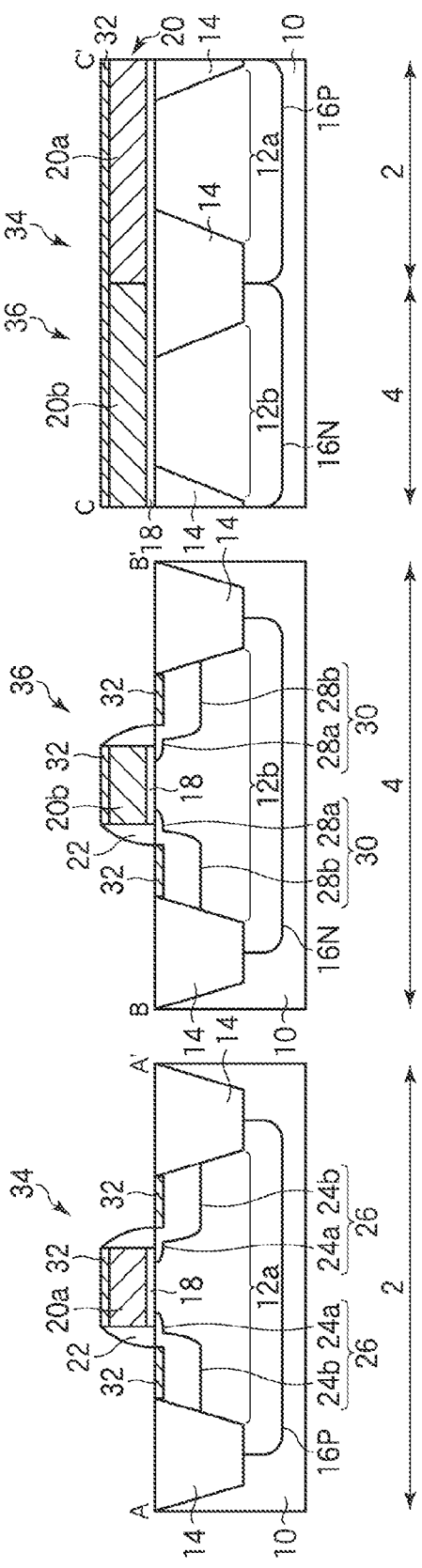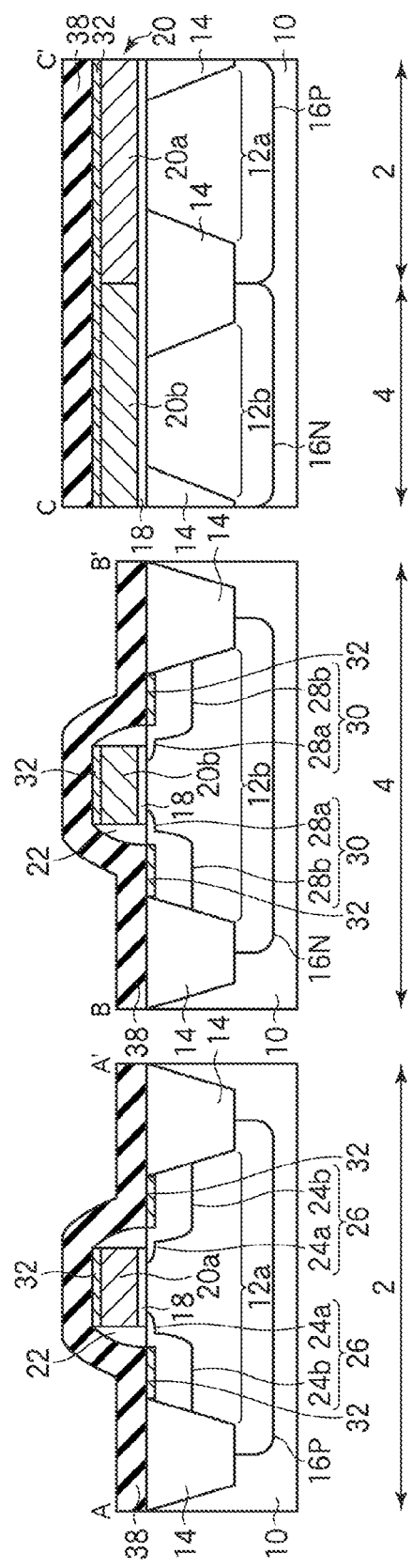

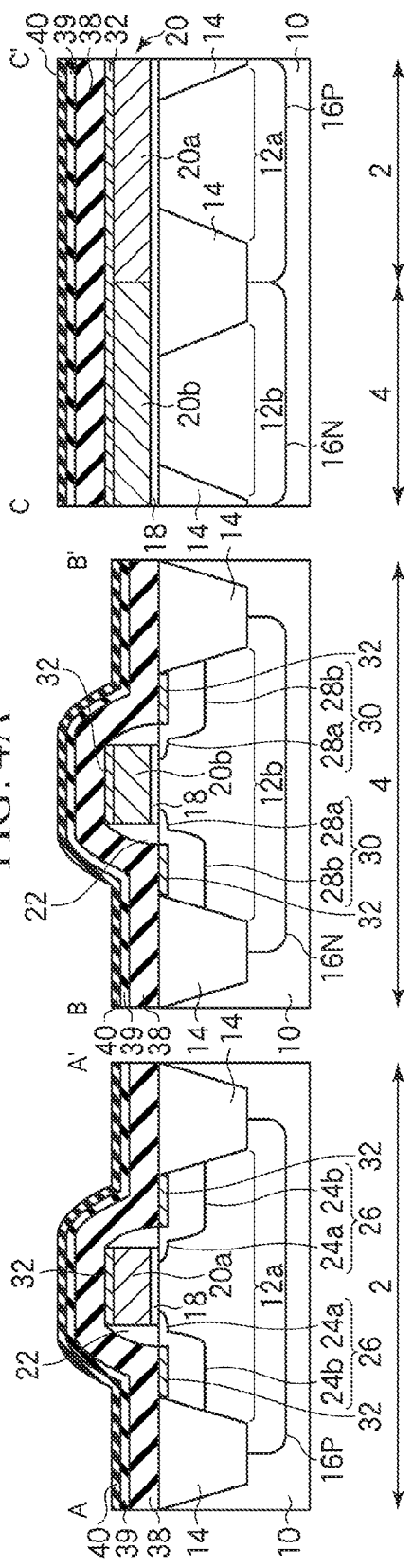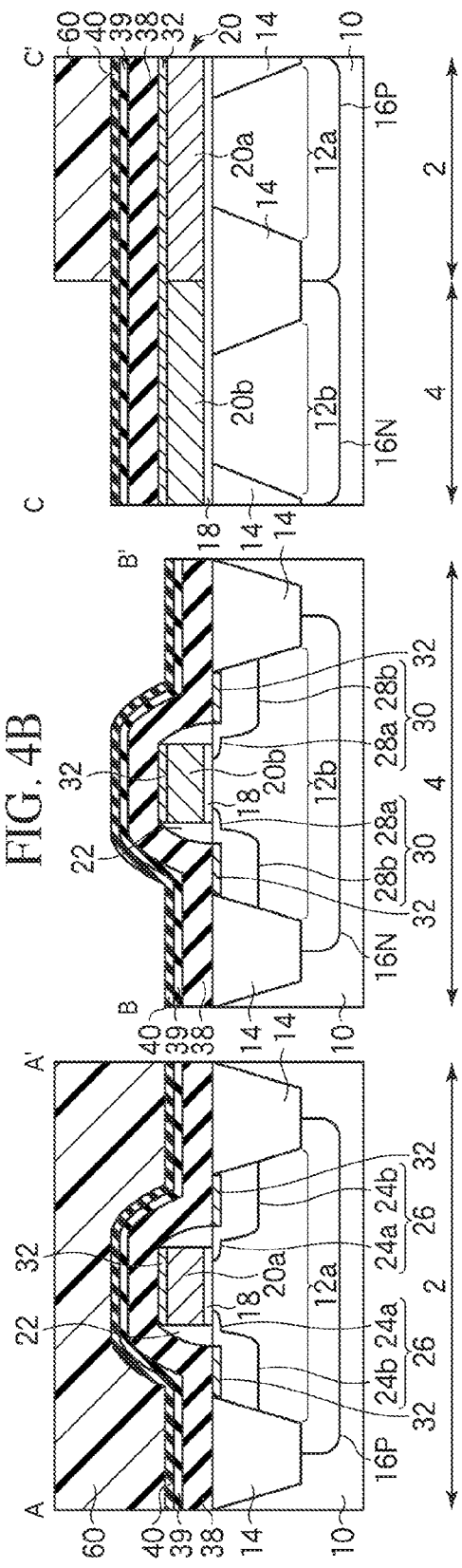

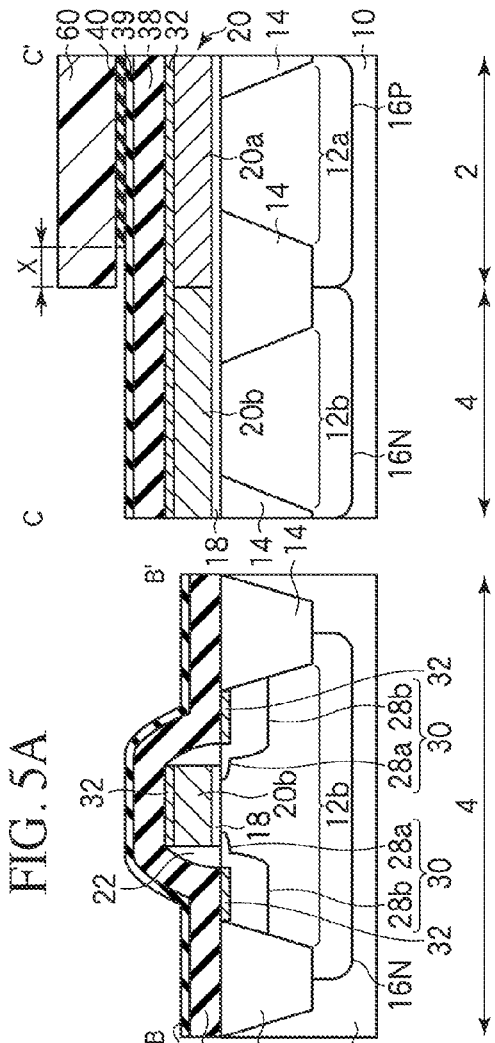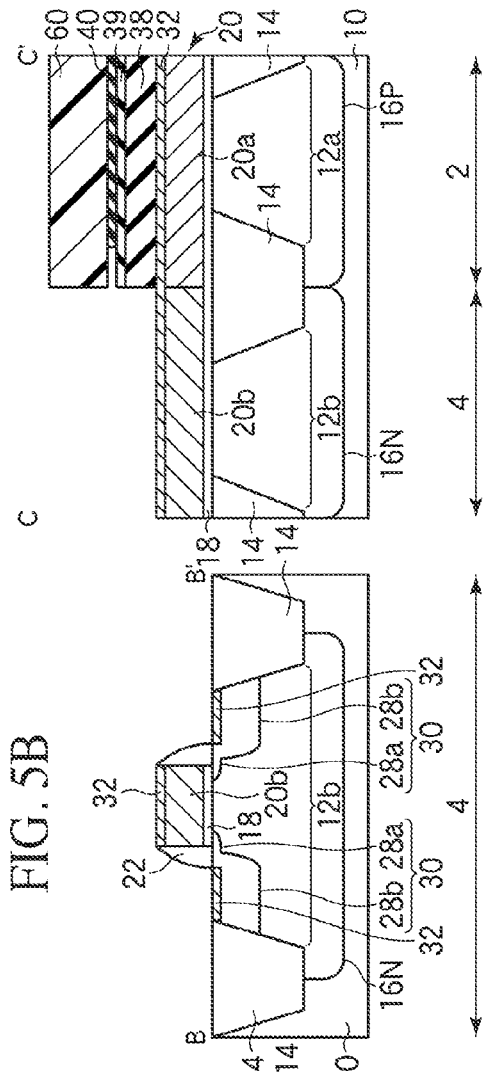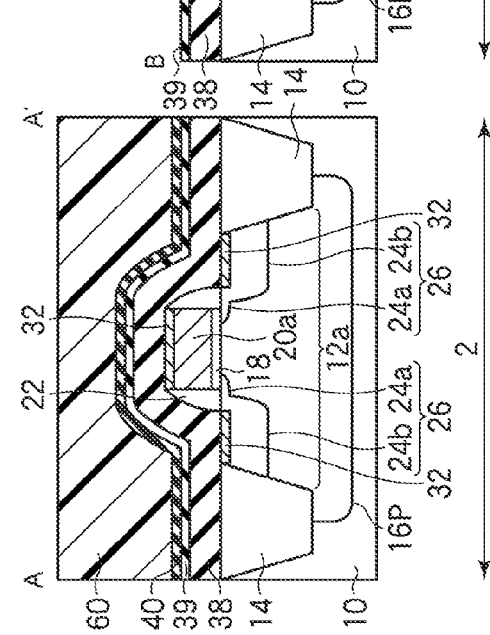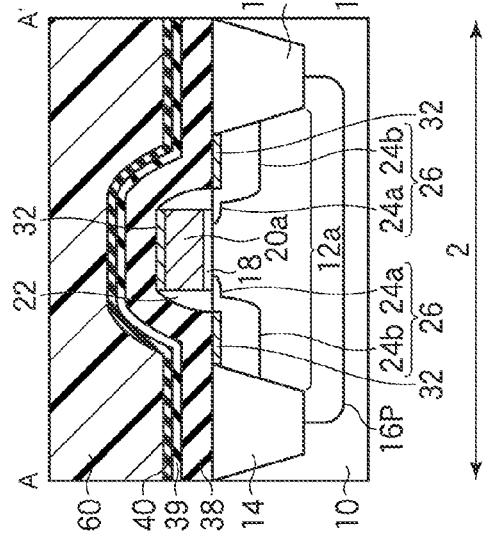

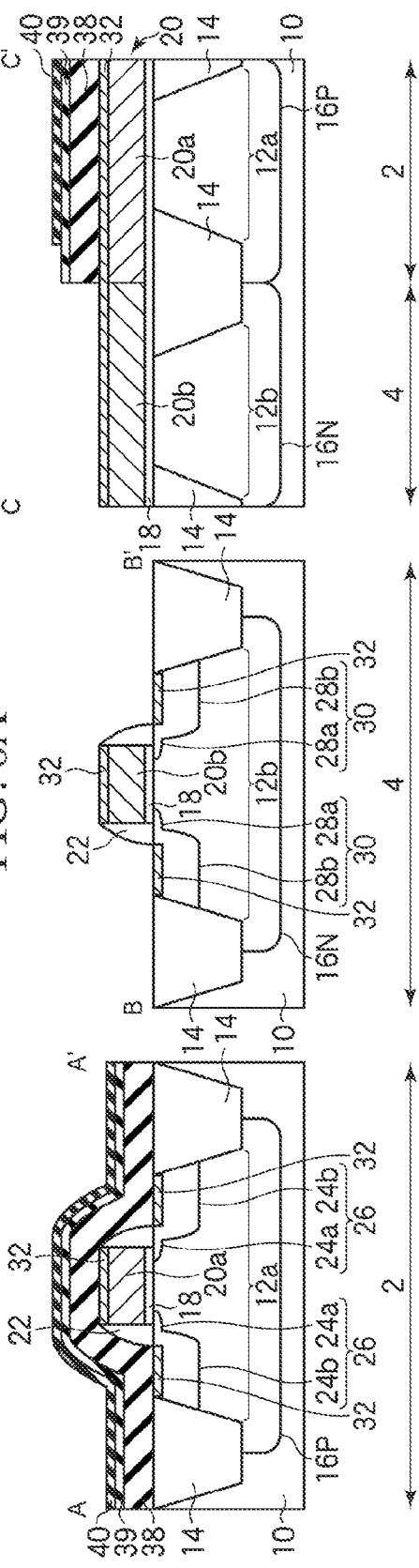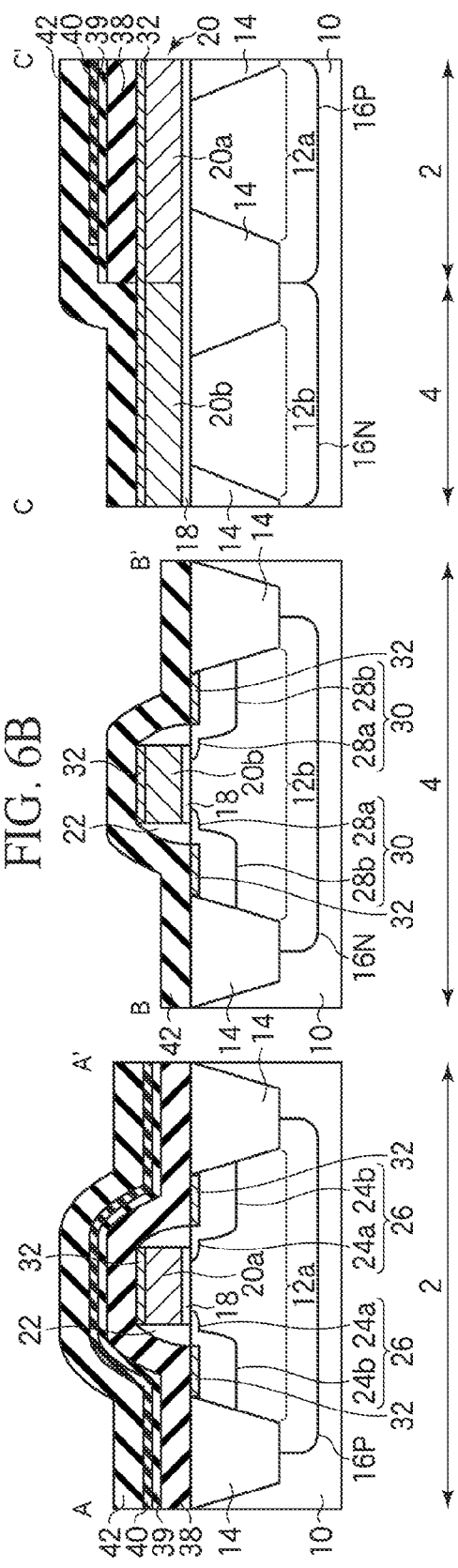

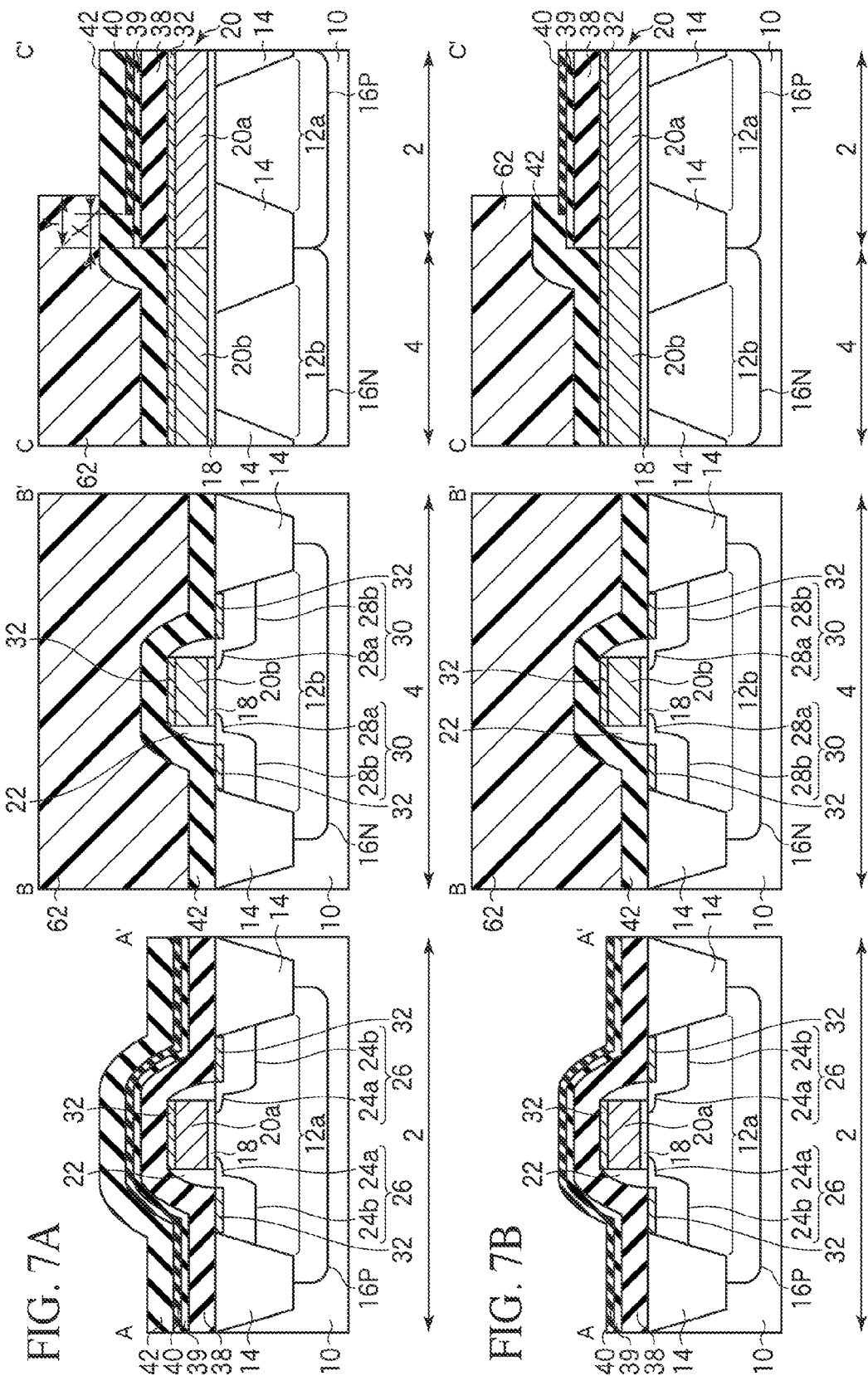

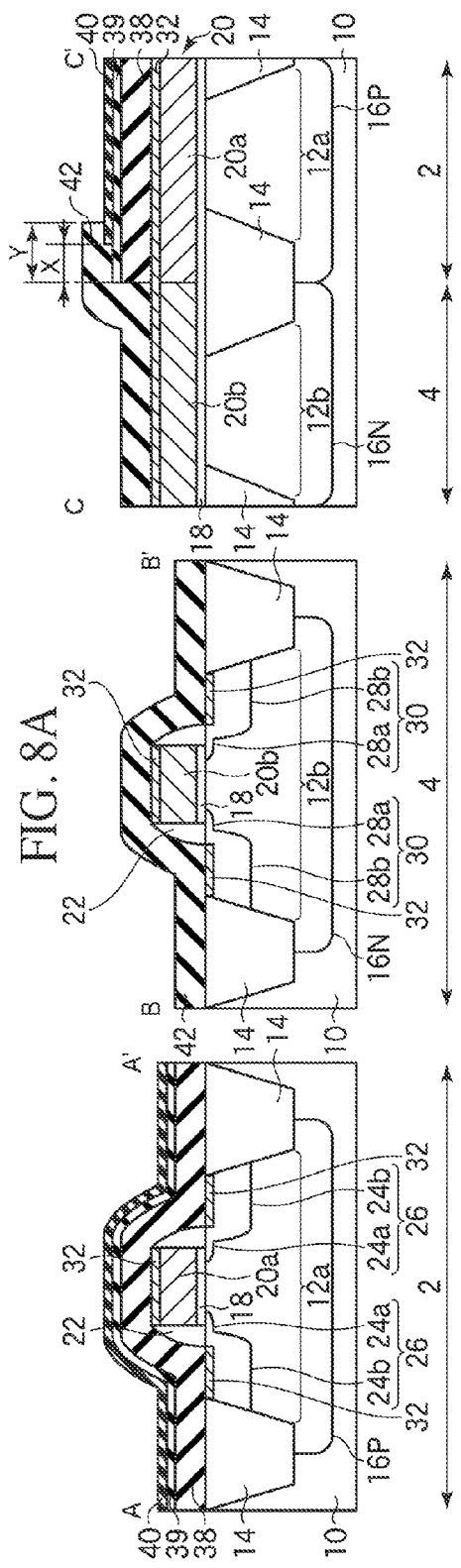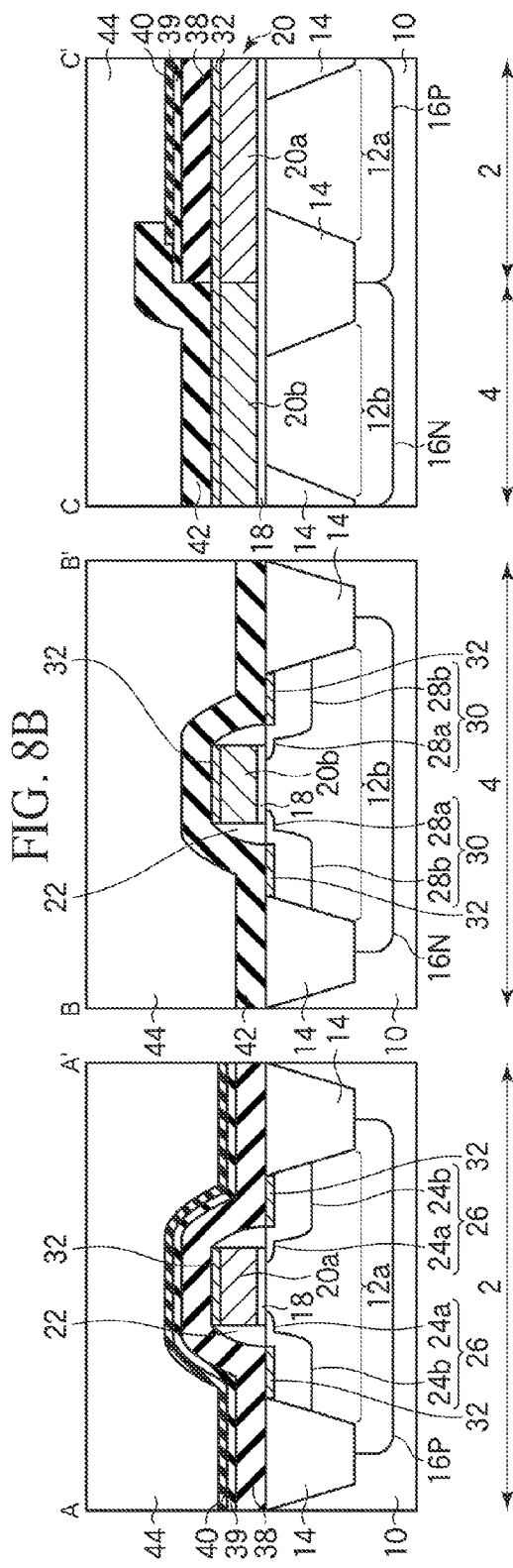

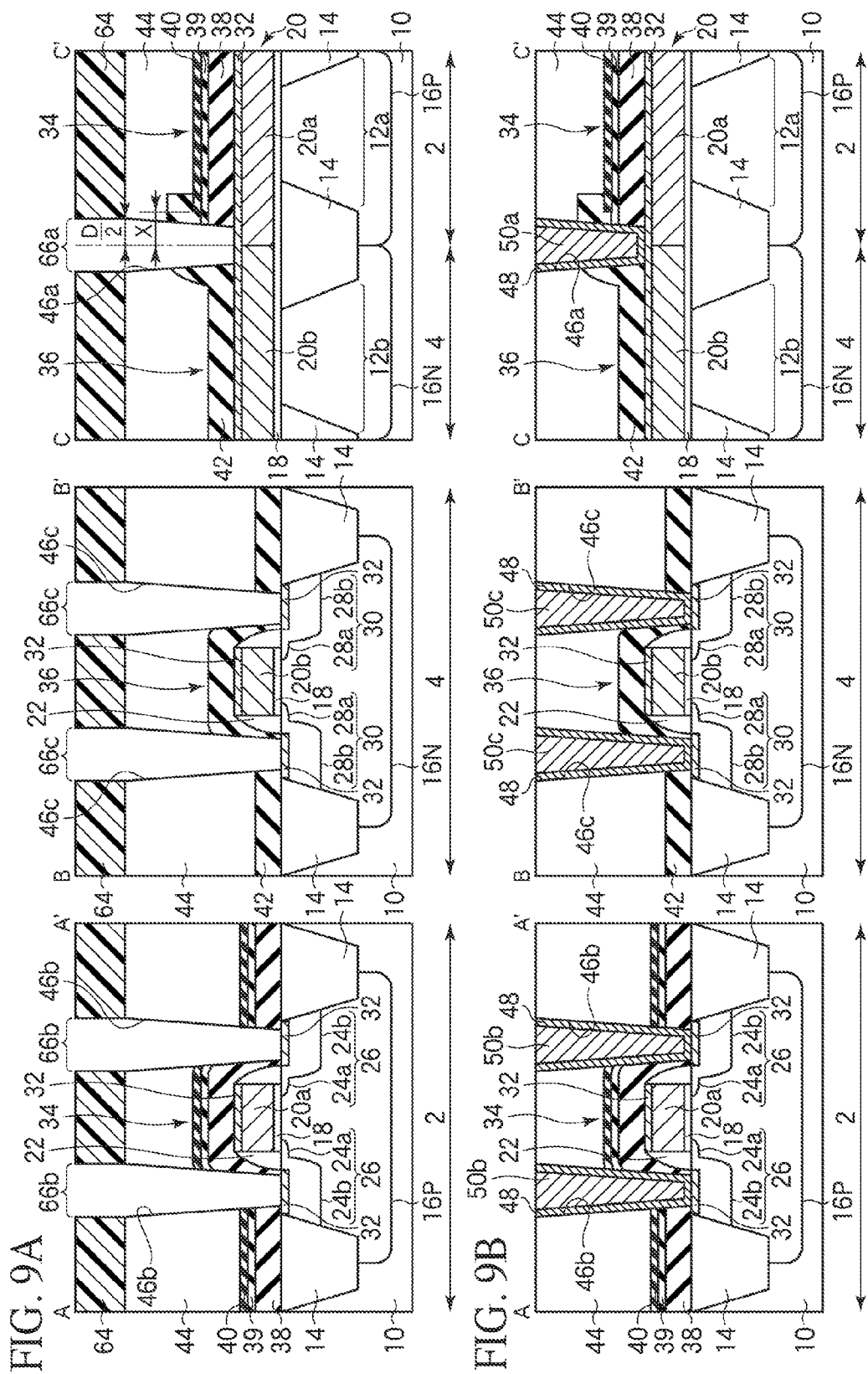

SEMICONDUCTOR DEVICE AND SEMICONDUCTOR DEVICE MANUFACTURING METHOD

CROSS-REFERENCE TO RELATED APPLICATION

This application is based upon and claims the benefit of priority of the prior Japanese Patent Application No. 2010-179384, filed on Aug. 10, 2010, the entire contents of which are incorporated herein by reference.

FIELD

The embodiments discussed herein are related to a semiconductor device and a method for manufacturing the semiconductor device.

BACKGROUND

Recently a semiconductor device comprising a CMOS circuit including a PMOS transistor and an NMOS transistor is noted.

In such semiconductor device, for example, a gate interconnect is formed continuously in a PMOS transistor forming region and in a NMOS transistor forming region. A part of the gate interconnect in the PMOS transistor forming region functions as the gate electrode of the PMOS transistor, and a part of the gate interconnect in the NMOS transistor forming region functions as the gate electrode of the NMOS transistor.

On the semiconductor substrate with the PMOS transistor and the NMOS transistor formed on, an inter-layer insulation film is formed, covering the PMOS transistor and the NMOS transistor. In the inter-layer insulation film, a contact hole is formed down to the gate interconnect. In the contact hole, an electrically conductive plug is formed.

As a technique for increasing the carrier mobility of the PMOS transistor, an insulation film (compressive stress film) is used, covering the PMOS transistor so that compressive stresses are applied to a channel region of the PMOS transistor. As a technique for increasing the carrier mobility of the NMOS transistor, an insulation film (tensile stress film) is used, covering the NMOS transistor so that tensile stresses are applied to the channel region of the NMOS transistor.

Related reference is as follows:
Japanese Laid-open Patent Publication No. 2007-208166;
Japanese Laid-open Patent Publication No. 2008-16853;
Japanese Laid-open Patent Publication No. 2007-235074;
Japanese Laid-open Patent Publication No. 2008-124133; and
Japanese Laid-open Patent Publication No. 2009-206467.

SUMMARY

According to one aspect of an embodiment, a semiconductor device manufacturing method includes forming a gate interconnect both in a first region and a second region of a semiconductor substrate, forming in the first region a first transistor including a first gate electrode which is a part of the gate interconnect, and forming in the second region a second transistor including a second gate electrode which is another part of the gate interconnect; forming over the semiconductor substrate a first stress film so as to cover the first transistor and the second transistor; forming a first etching stopper film over the first stress film; forming over the first etching stopper film a second etching stopper film whose etching characteristic is different from an etching characteristic of the first etching stopper film; forming a first mask layer covering the first region and exposing the second region; removing the second etching stopper film in the second region with the first mask layer as a mask and the first etching stopper film as the stopper, and isotropically etching the second etching stopper film located below the first mask layer; etching off the first etching stopper film and the first stress film in the second region with the first mask layer as a mask; forming over the semiconductor substrate the second stress film whose etching characteristic is different from an etching characteristic of the second etching stopper film, covering the second transistor, the first stress film, the first etching stopper film and the second etching stopper film; forming over the second stress film a second mask layer covering the second region, an end face of the second mask layer on the side of the first region being located over the second etching stopper film; etching the second stress film with the second mask layer as the mask so that a part of the second stress film overlaps a part of the first stress film and a part of the second etching stopper film; forming over the semiconductor substrate an insulation film, covering the first stress film, the second stress film, the first etching stopper film and the second etching stopper film; forming a contact hole through the insulation film, the second stress film, the first etching stopper film and the first stress film down to the gate interconnect at a border between the first region and the second region; and forming an electrically conductive plug in the contact hole.

According to another aspect of the embodiment, a semiconductor device includes a gate interconnect formed both in a first region and a second region of a semiconductor substrate; a first transistor formed in the first region and including a first gate electrode which is a part of the gate interconnect, and first source/drain diffusion layers formed in the semiconductor substrate on both sides of the first gate electrode; a second transistor formed in the second region and including second gate electrode which is another part of the gate interconnect and second source/drain diffusion layers formed in the semiconductor substrate on both side of the second gate electrodes; a first stress film formed over the semiconductor substrate in the first region so as to cover the first transistor; a first etching stopper film formed over the first stress film; a second etching stopper film whose etching characteristic is different from an etching characteristic of the first etching stopper film and formed over the first region except a part thereof near the second region; a second stress film formed over the semiconductor substrate in the second region so as to cover the second transistor, an edge of the second stress film on the side of the first region being overlapped with a part of the first stress film, a part of the first etching stopper film and a part of the second etching stopper film; an insulation film formed over the semiconductor substrate so as to cover the first stress film, the first etching stopper film, the second etching stopper film and the second stress film; and an electrically conductive plug formed in a contact hole formed through the insulation film, the second stress film, the first etching stopper film and the first stress film down to the gate interconnect at a border between the first region and the second region, the end face of the second etching stopper film on the side of the second region receding from the end face of the first stress film on the side of the second region.

The object and advantages of the embodiments will be realized and attained by means of the elements and combinations particularly pointed out in the claims.

It is to be understood that both the foregoing general description and the following detailed description are exemplary and explanatory and are not restrictive of the embodiments, as claimed.

BRIEF DESCRIPTION OF DRAWINGS

FIGS. 3A to 10 are sectional views of the semiconductor device according to the embodiment in the steps of the method for manufacturing the semiconductor device, which illustrate the method;

DESCRIPTION OF EMBODIMENTS

By the proposed techniques, often a defective contact to the gate electrode has occurred.

Figure 11A:
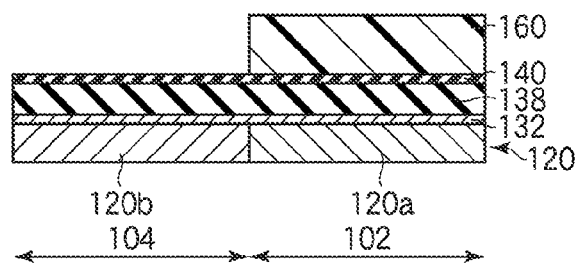
FIGS. 11A to 12 are sectional views of the semiconductor device in the steps of forming a contact hole down to a gate interconnect of a CMOS circuit.
Figure 11B:
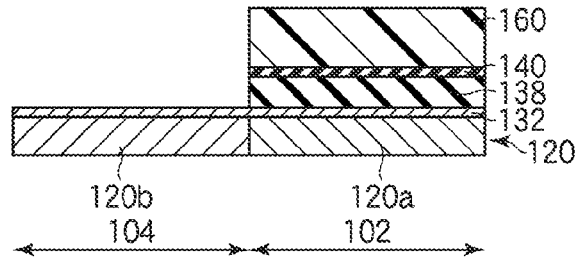
Figure 11C:
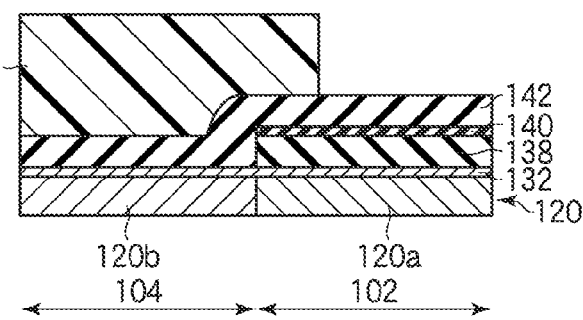
Figure 11D:
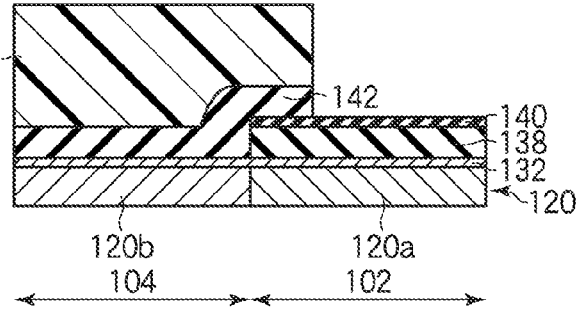
Figure 11E:
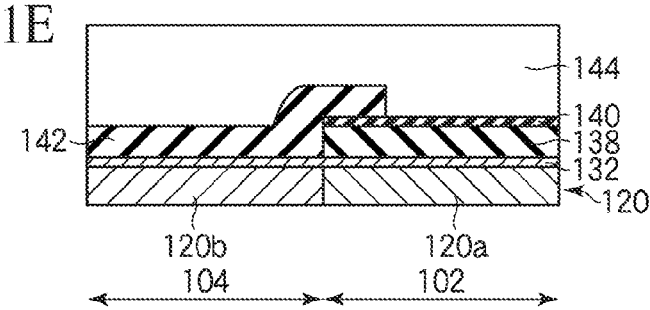
Figure 12:
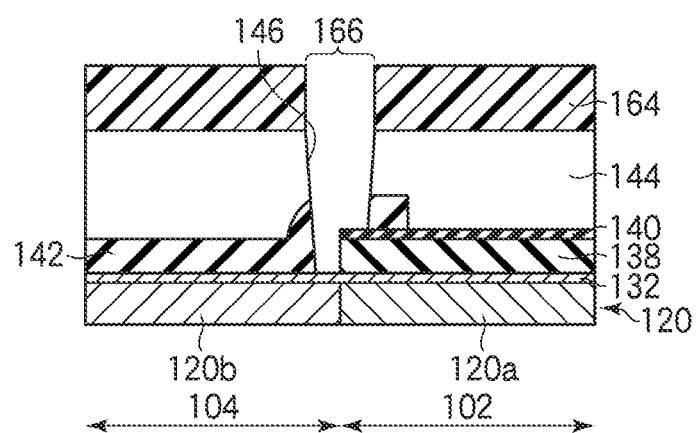

FIGS. 11A to 12 are sectional views illustrating forming a contact hole down to a gate interconnect of a CMOS circuit. In FIGS. 11A to 12, a part below a gate interconnect 120 is not illustrated.

In a PMOS transistor forming region 102 and an NMOS transistor forming region 104, a gate interconnect 120 including the gate electrode 120a of the PMOS transistor and the gate electrode 120b of the NMOS transistor are formed (see FIG. 11A). Upper part of the gate interconnect 120, a silicide layer 132 is formed. On the entire semiconductor substrate (not illustrated) with the PMOS transistor and the NMOS transistor formed on, a compressive stress film 138 is formed all over the surface. On the compressive stress film 138, an etching stopper film 140 of, e.g., silicon oxide film is formed. On the etching stopper film 140, a photoresist film 160 covering the PMOS transistor forming region 102 and exposing the NMOS transistor forming region 104 is formed.

Next, as illustrated in FIG. 11B, with the photoresist film 160 as the mask, the etching stopper film 140 and the compressive stress film 138 are etched.

Then, as illustrated in FIG. 11C, a tensile stress film 142 is formed on the entire surface.

Next, on the tensile stress film 142, a photoresist film 162 is formed. The photoresist film 162 is formed, covering not only the NMOS transistor forming region 104 but also a part of the PMOS transistor forming region 102, which is near the NMOS transistor forming region 104.

As illustrated in FIG. 11D, with the photoresist film 162 as the mask and with the etching stopper film 140 as the etching stopper, the tensile stress film 142 is etched. Because of the photoresist film 162 formed covering the NMOS transistor forming region 104 and also a part of the PMOS transistor forming region 102, the end of the tensile stress film 142 on the side of the PMOS transistor forming region 102 is located on the etching stopper film 140. The etching of the tensile stress film 142 stops at the etching stopper film 140, and the compressive stress film 138 and the silicide layer 132 are never etched at the border of the PMOS transistor forming region 102 and the NMOS transistor forming region 104.

Then, as illustrated in FIG. 11E, an inter-layer insulation film 144 is formed on the entire surface.

Next, as illustrated in FIG. 12, a photoresist film 164 having an opening 166 is formed.

Then, with the photoresist film 164 as the mask, the inter-layer insulation film 144, etc. are etched to form a contact hole 146 down to the gate interconnect 120.

When the contact hole 146 which arrives at the gate interconnect 120 is thus formed, a part of the etching stopper film 140 is present at a part of the portion where the contact hole 146 is to be formed and prevents etching. As a result, as illustrated in FIG. 12, there are risks that the contact hole 146 might have the sectional area decreased at the lower part and have a defective contact hole.

The compressive stress film 138 does not always have good adhesion to the semiconductor substrate, and when the tensile stress film 142 is formed after the compressive stress film 138 has been formed as illustrated in FIGS. 11A to 12, the compressive stress film 138 often peels. Often, sufficient compressive stresses cannot be applied to the channel region of the PMOS transistor because of the peeling of the compressive stress film 138.

As a technique for solving the issue of the peeling of the compressive stress film, it is well-known to form the tensile stress film earlier than forming the compressive stress film. The tensile stress film has better adhesion to the semiconductor substrate than the compressive stress film and does not easily peel. When the tensile stress film is formed in advance, and the compressive stress film is formed later, the peeling of the compressive stress film can be prevented.

On the other hand, as a technique for preventing the defective opening of the contact hole 146, it is an idea to side-etch the etching stopper film 140 to separate the end face of the etching stopper film 140 from the region where the contact hole 146 is to be formed. When the etching stopper film 140 is silicon oxide film, an etchant containing, e.g., hydrofluoric acid is used to side-etch the etching stopper film 140.

However, the tensile stress film has low resistance to hydrofluoric acid. When the tensile stress film is formed in advance, and the compressive stress film is formed later, even the tensile stress film present below the etching stopper film 140 is etched during side-etching the etching stopper film 140. When the tensile stress film present below the etching stopper film 140 is etched, sufficient tensile stresses cannot be applied to the channel regions of the transistors.

The inventor of the present application made earnest studies and have got the idea of manufacturing a semiconductor device of high reliability with high manufacturing yields as follows.

Preferred embodiments of the present invention will be explained with reference to accompanying drawings.

[a] One Embodiment

The semiconductor device according to one embodiment and its manufacturing method will be described with reference to FIGS. 1 to 10.

(Semiconductor Device)

Figure 1:
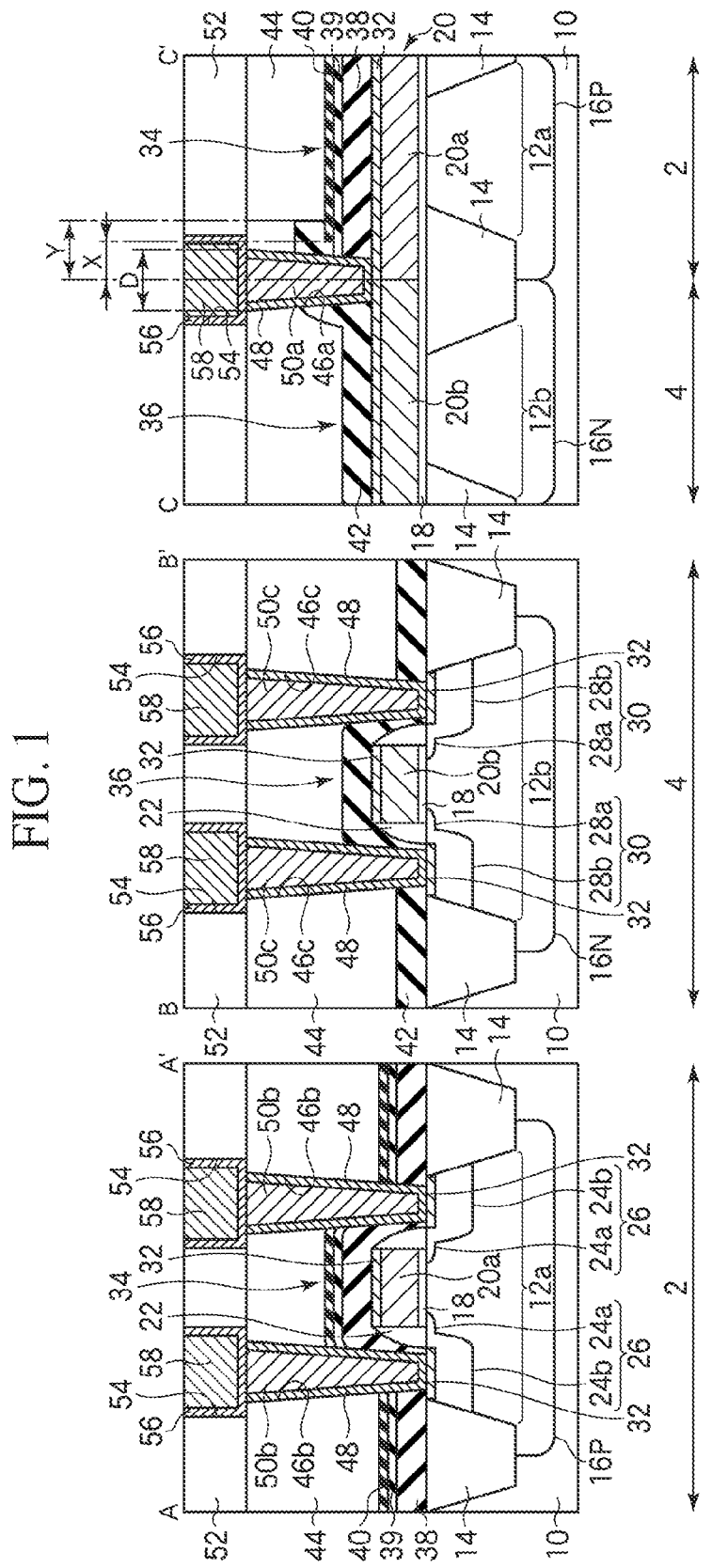
FIG. 1 is a sectional view of a semiconductor device according to one embodiment, which illustrates the semiconductor device.
Figure 2:
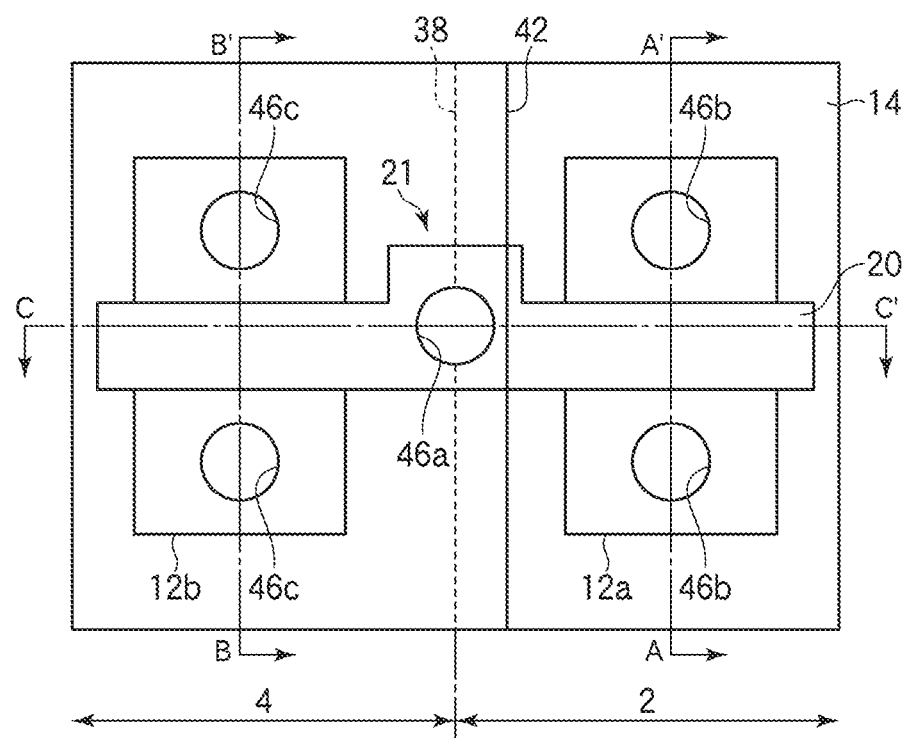
FIG. 2 is a plan view of the semiconductor device according to the embodiment.

First, the semiconductor device according to the present embodiment will be described with reference to FIGS. 1 and 2. FIG. 1 is sectional views of the semiconductor device according to the present embodiment. FIG. 2 is a plan view of the semiconductor device according to the present embodiment. The drawing on the left side of FIG. 1 illustrates an NMOS transistor forming region (a region for an NMOS transistor to be formed in, a first transistor forming region) 2 and corresponds to the A-A' line section in FIG. 2. The drawing at the center of FIG. 1 illustrates a PMOS transistor forming region (a region for a PMOS transistor to be formed in, a second transistor forming region) 4 and corresponds to the B-B' line section in FIG. 2. The drawing on the right side of FIG. 1 is the cross sectional view along a gate interconnect and corresponds to the C-C' line section in FIG. 2.

As illustrated in FIG. 1, device isolation regions 14 defining device regions 12a, 12b are formed on a semiconductor substrate 10. The semiconductor substrate 10 is, e.g., a P-type silicon substrate. In the NMOS transistor forming region 2 and in the PMOS transistor forming region 4, the device regions 12a and 12b defined by the device isolation regions 14 are formed.

In the semiconductor substrate 10 of the NMOS transistor forming region 2, a P-type well 16P is formed. In the semiconductor substrate 10 of the PMOS transistor forming region 4, an N-type well 16N is formed.

In the NMOS transistor forming region 2, a gate electrode 20a is formed with a gate insulation film 18 formed therebetween. In the PMOS transistor forming region 4, a gate electrode 20b is formed with the gate insulation film 18 formed therebetween.

The gate electrode 20a and the gate electrode 20b are parts of the gate interconnect 20 continuously formed in the NMOS transistor forming region 2 and the PMOS transistor forming region 4. The gate interconnect 20 is, e.g., polysilicon film or others. The gate interconnect 20 may include a silicide film 32, etc. formed on such polysilicon film, etc.

The gate interconnect 20 is formed wider in the region near the boundary between the NMOS transistor forming region 2 and the PMOS transistor forming region 4, i.e., the border (see FIG. 2). That is, a wider portion (connection portion) 21 is formed in the gate interconnect 20 at the border between the NMOS transistor forming region 2 and the PMOS transistor forming region 4. Accordingly, the width of the gate interconnect 20 at the border between the NMOS transistor forming region 2 and the PMOS transistor forming region 4 is set larger than the width of the gate interconnect 20 in the device regions 12a, 12b. Such wider portion 21 is formed in the gate interconnect 20 because a contact hole 46a for an electrically conductive plug 50a to be formed in can be formed connecting to the gate interconnect 20 above the border between the NMOS transistor forming region 2 and the PMOS transistor forming region 4.

In the gate interconnect 20 in the NMOS transistor forming region 2, an N-type dopant impurity is implanted, whereby the gate electrode 20a of the NMOS transistor 34 is formed. In the gate interconnect 20 in the PMOS transistor forming region 4, a P-type dopant impurity is implanted, whereby the gate electrode 20b of the PMOS transistor 36 is formed. Thus, the part of the gate interconnect 20 in the NMOS transistor forming region 2 is the gate electrode 20a of the NMOS transistor 34, and the part of the gate interconnect 20 in the PMOS transistor formed region 4 is the gate electrode 20b of the PMOS transistor 36.

The boundary between the gate electrode 20a of the NMOS transistor 34 and the gate electrode 20b of the PMOS transistor 36 is in agreement with the boundary between the NMOS transistor forming region 2 and the PMOS transistor forming region 4.

A sidewall insulation film 22 is formed on the side wall of the gate interconnect 20, i.e., the side wall of the gate electrode 20a of the NMOS transistor 34 and the side wall of the gate electrode 20b of the PMOS transistor 36.

In the semiconductor substrate 10 on both sides of the gate electrode 20a with the sidewall insulation film 22 formed on, source/drain diffusion layers 26 each including a lightly doped impurity diffusion layer (an extension region) 24a and a heavily doped impurity diffusion layer 24b are formed.

In the semiconductor substrate 10 on both sides of the gate electrode 20b with the sidewall insulation film 22 formed on, source/drain diffusion layers 30 each including a lightly doped impurity diffusion layer (an extension region) 28a and a heavily doped impurity diffusion layer 20b are formed.

Silicide layers 32 are formed at the upper part of the gate interconnect 20 and the source/drain diffusion layers 26, 30, respectively. The silicide layers 32 are, e.g., nickel silicide layer, cobalt silicide layer or others. The silicide layers 32 on the source/drain diffusion layers 26, 30 function as the source/drain electrodes. The silicide layer 32 on the gate interconnect 20 is for better connection between the gate interconnect 20 and the conductor plug 50a formed in the contact hole 46a and for decrease of the resistance of the connection.

Thus, in the NMOS transistor forming region 2, the NMOS transistor (first transistor) 34 including the gate electrode 20a and the source/drain diffusion layers 26, etc. is formed. In the PMOS transistor forming region 4, the PMOS transistor (second transistor) 36 including the gate electrode 20b and the source/drain diffusion layers 30, etc. is formed.

On the semiconductor substrate 10 in the NMOS transistor forming region 2, a tensile stress film 38 is formed, covering the NMOS transistor 34. The tensile stress film 38 applies tensile stresses to the channel region of the NMOS transistor 34 to improve the carrier mobility. The tensile stress film 38 is, e.g., silicon nitride film. Preferably, the film thickness of the tensile stress film 38 is set within a range of, e.g., 30-100 nm. The film thickness of the tensile stress film 38 is set at, e.g., about 80 nm here. The end face of the tensile stress film 38 on the side of the PMOS transistor forming region 4 is in agreement with the boundary between the NMOS transistor forming region 2 and the PMOS transistor forming region 4.

On the tensile stress film 38, a first etching stopper film 39 which is different from a second etching stopper film 40 to be described later in the etching characteristics is formed. The first etching stopper film 39 functions as the etching stopper in etching the second etching stopper film 40 to be described later. On the other hand, it is preferable that the first etching stopper film 39 does not prevent the etching from forming the contact holes 46a to be described later. In the present embodiment, the first etching stopper film 39 is the same film as the compressive stress film 42. The compressive stress film 42 has high resistance to hydrofluoric acid. When the second etching stopper film 40 is silicon oxide film, an etchant containing hydrofluoric acid is used in etching the second etching stopper film 40. By forming the first etching stopper film 39 of the same film as the compressive stress film 42, in etching the second etching stopper film 40, the first etching stopper film 39 can function as the etching stopper. By forming the first etching stopper film 39 of the same film as the compressive stress film 42, in forming the contact hole 46a, the first etching stopper film 39 is etched together with the compressive stress film 42. Thus, in forming the contact hole 46a, the first etching stopper film 39 never prevent the etching.

In forming the compressive stress film 42, a raw material gas containing carbon is used. Accordingly, the compressive stress film 42 contains carbon. When the first etching stopper film 39 is formed of the same film as the compressive stress film 42, the first etching stopper film 39 contains carbon. On the other hand, in forming the tensile stress film 38, a material gas containing carbon is not used. Accordingly, the content ratio of carbon of the first etching stopper film 39 is higher than the carbon content ratio of the tensile stress film 38. The higher carbon content ratio of the first etching stopper film 39 than the carbon content ratio of the tensile stress film 38 will be one factor for the higher hydrofluoric acid resistance of the first etching stopper film 39 than the hydrofluoric acid resistance of the tensile stress film.

UV rays are not applied to the compressive stress film 42 but are applied to the tensile stress film 38. Accordingly, the film density of the tensile stress film 38 is lower than the film density of the compressive stress film 42. When the first etching stopper film 39 is formed of the same film as the compressive stress film 42, UV rays are not applied to the first etching stopper film 39. Accordingly, the film density of the first etching stopper film 39 is higher than the film density of the tensile stress film 38. The high film density will be one factor for the high hydrofluoric acid resistance of the fist etching stopper film 39.

Preferably, the film thickness of the first etching stopper film 39 is set within a range of, e.g., 10-50 nm. The film thickness of the first etching stopper film 39 is about 30 nm here.

The first etching stopper film 39 is present on the entire upper surface of the tensile stress film 38. Accordingly, when the first etching stopper film 39, which is the compressive stress film, is thicker, the tensile stresses to be applied to the channel regions of the NMOS transistor 34 by the tensile stress film 38 are mitigated by the etching stopper film 39. Then, sufficient tensile stresses cannot be applied to the channel region of the NMOS transistor 34. When the first etching stopper film 39 is a compressive stress film, preferably, the film thickness of the first etching stopper 39 is smaller than the film thickness of the tensile stress film 38. More preferably, the film thickness of the first etching stopper film 39 is ½ or below of the film thickness of the tensile stress film 38.

On the first etching stopper film 39, the second etching stopper film 40, which is different from the first etching stopper film 39 in the etching characteristics, is formed. In the etching of the compressive stress film (second stress film) 42 to be described later, the second etching stopper film 40 functions as the etching stopper. The second etching stopper film 40 is, e.g., silicon oxide film. Preferably, the film thickness of the second etching stopper film 40 is set within a range of, e.g., 10-50 nm. The film thickness of the second etching stopper film 40 is, e.g., about 30 nm here. The second etching stopper film 40 is formed in the part of the NMOS transistor forming region 2 except the part near the PMOS transistor forming region 4. That is, the end face of the second etching stopper film 40 on the side of the PMOS transistor forming region 4 is spaced from the boundary between the NMOS transistor forming region 2 and the PMOS transistor forming region 4. The distance X between the end face of the second etching stopper film on the side of the PMOS transistor forming region 4 and the boundary between the NMOS transistor forming region 2 and the PMOS transistor forming region 4 is, e.g., about 60 nm.

On the semiconductor substrate 10 in the PMOS transistor forming region 4, the compressive stress film (second stress film) 42 is formed covering the PMOS transistor 36. The compressive stress film 42 applies compressive stresses to the channel region of the PMOS transistor 36 to thereby increase the carrier mobility. The etching characteristics of the compressive stress film 42 are different from the etching characteristics of the second etching stopper film 40. The compressive stress film 42 is, e.g., silicon nitride film. Preferably, the film thickness of the compressive stress film 42 is set within a range of, e.g., 30-100 nm. The film thickness of the compressive stress film 42 is, e.g., about 80 nm here. The edge of the compressive stress film 42 on the side of the NMOS transistor forming region 2 overlaps a part of the tensile stress film 38, a part of the first etching stopper film 39 and a part of the second etching stopper film 40. The distance Y between the end face of the compressive stress film 42 on the side of the PMOS transistor forming region 2 and the boundary between the NMOS transistor forming region 2 and the PMOS transistor forming region 4 is, e.g., about 80 nm. In the present embodiment, the compressive stress film 42 is formed after the tensile stress film 38 has been formed, whereby the compressive stress film 42 can be prevented from peeling.

An inter-layer insulation film 44 is formed on the semiconductor substrate 10 with the tensile stress film 38, the first etching stopper film 39, the second etching stopper film 40 and the compressive stress film 42 formed on. The surface of the inter-layer insulation film 44 is planarized. Preferably, the film thickness of the inter-layer insulation film 44 is set within a range of, e.g., 200-500 nm. The film thickness of the inter-layer insulation film 44 is, e.g., about 400 nm here. The inter-layer insulation film 44 is, e.g., silicon oxide film, PSG (Phospho Silicate Glass) film or others.

In the inter-layer insulation film 44, the compressive stress film 42, the first etching stopper film 39 and the tensile stress film 38, the contact hole 46a is formed down to the gate interconnect 20. The contact hole 46a is formed down to the gate interconnect at the border between the NMOS transistor forming region 2 and the PMOS transistor forming region 4. The contact hole 46a is located above the device isolation region 14 located between the device region 12a and the device region 12b. The contact hole 46a is formed through the inter-layer insulation film 44, the compressive stress film 42, the first etching stopper film 39 and the tensile stress film 38. The end face of the second etching stopper film 40 on the side of the PMOS transistor forming region 4 is spaced from the contact hole 46a.

In the present embodiment, for the following reason, the contact hole 46a is formed down to the gate interconnect 20 at the border between the NMOS transistor forming region 2 and the PMOS transistor forming region 4. That is, when the contact hole 46a is formed at a position offset from the boundary between the NMOS transistor forming region 2 and the PMOS transistor forming region 4, the size of either of the NMOS transistor forming region 4 and the PMOS transistor forming region 4 becomes larger. To minimize the size of the NMOS transistor forming region 2 and the PMOS transistor forming region 4, preferably, the contact hole 46a is so positioned that it arrives at the gate interconnect 20 at the border between the NMOS transistor forming region 2 and the PMOS transistor forming region 4. For this reason, in the present embodiment, the contact hole 46a is formed down to the gate interconnect 20 at the border between the NMOS transistor forming region 2 and the PMOS transistor forming region 4.

In the inter-layer insulation film 44, the second etching stopper film 40, the first etching stopper film 39 and the tensile stress film 38 in the NMOS transistor forming region 2, the contact holes 46b are formed down to the source/drain electrodes 32 of the NMOS transistor 34.

In the inter-layer insulation film 44 and the compressive stress film 42 in the PMOS transistor forming region 4, the contact holes 46c are formed down to the source/drain electrodes 32 of the PMOS transistor 36.

The diameter D of the tops of the contact holes 46a-46c is set at, e.g., about 80 nm.

A barrier metal film 48 is formed on the bottom surfaces and the side surfaces of the contact holes 46a-46c. The barrier metal film 48 is formed, e.g., of a Ti film (not illustrated) and a TiN film (not illustrated) sequentially stacked.

In the contact holes 46a-46c with the barrier metal film 48 formed on, the electrically conductive plugs 50a-50c are formed. As the material of the electrically conductive plugs 50a-50c, tungsten (W), for example, is used. The electrically conductive plug 50a is connected to the gate interconnect 20 at the border between the NMOS transistor forming region 2 and the PMOS transistor forming region 4. The electrically conductive plugs 50b are connected to the source/drain electrodes 32 of the NMOS transistor 34. The electrically conductive plugs 50c are connected to the source/drain electrodes 32 of the PMOS transistor 36.

On the inter-layer insulation film 44 with the electrically conductive plugs 50a-50c formed in, an inter-layer insulation film 52 is formed. As the inter-layer insulation film 52, silicon oxide film, for example, is used.

In the inter-layer insulation film 52, trenches 54 for interconnects 58 to be formed in are formed. At the bottom surfaces of the trenches 54, the upper surfaces of the electrically conductive plugs 50a-50c are exposed.

In the trenches 54, a barrier metal film 56 is formed. As the barrier metal film 56, Ta (tantalum) film, for example, is used.

In the trenches 54 with the barrier metal film 56 formed in, the interconnects 58 are formed. As the material of the interconnects 58, Cu (copper) or others, for example, is used.

The semiconductor device comprising the CMOS circuit including the NMOS transistor 34 and the PMOS transistor 36 is thus constituted.

As described above, according to the present embodiment, the end face of the second etching stopper film 40 on the side of the PMOS transistor forming region 4 is separated from the contact hole 46a. Thus, according to the present embodiment, the contact hole 46a is formed down to the gate interconnect 20 at the border between the NMOS transistor forming region 2 and the PMOS transistor forming region 4 without the etching being prevented by the second etching stopper 40. According to the present embodiment, the good contact hole 46a is formed through the inter-layer insulation film 44, the compressive stress film 42, the first etching stopper film 39 and the tensile stress film 38. In such contact hole 46a, the electrically conductive plug 50a is formed, and the electrically conductive plug 50a and the gate interconnect 20 can be surely connected. Furthermore, according to the present embodiment, because of the first etching stopper film 39 formed on the tensile stress film 38, in side-etching the second etching stopper film 40, the tensile stress film 39 is prevented from being etched. Besides, the first etching stopper film 39 can be etched together with the compressive stress film 42 when the contact hole 46a is formed, the first etching stopper film 39 never prevent the formation of the contact hole 46a. Furthermore, according to the present embodiment, the compressive stress film 42 is formed after the tensile stress film 38 has been formed, whereby the compressive stress film 42 is prevented from peeling. Thus, according to the present embodiment, the semiconductor device of high reliability can be provided with high manufacturing yields.

(Method for Manufacturing the Semiconductor Device)

Next, the method for manufacturing the semiconductor device according to the present embodiment will be described with reference to FIGS. 3A to 10. FIGS. 3A to 10 are sectional views of the semiconductor device according to the present embodiment in the steps of the method for manufacturing the semiconductor device, which illustrate the method.

First, by, e.g., STI (Shallow Trench Isolation), the device isolation regions 14 defining the device regions 12a, 12b are formed in the semiconductor substrate 10 (see FIG. 3A). The semiconductor substrate 10 is, e.g., a P-type silicon substrate. Thus, in the NMOS transistor forming region 2, the device region 12a defined by the device isolation regions 14 is formed. In the PMOS transistor forming region 4, the device region 12b defined by the device isolation regions 14 is formed.

Next, on the entire surface, a photoresist film (not illustrated) is formed by, e.g., spin coating.

Next, by photolithography, an opening (not illustrated) exposing the NMOS transistor forming region 2 is formed in the photoresist film.

Next, with the photoresist film as the mask a P-type dopant impurity is implanted into the semiconductor substrate 10 by, e.g., ion implantation. Thus, the P-type well 16P is formed in the semiconductor substrate 10 in the NMOS transistor forming region 2. Then, the photoresist film is released by ashing.

Next, on the entire surface, a photoresist film (not illustrated) is formed by, e.g., spin coating.

Next, by photolithography, an opening (not illustrated) exposing the PMOS transistor forming region 4 is formed in the photoresist film.

Next, with the photoresist film as the mask, an N-type dopant impurity is implanted into the semiconductor substrate 10 by, e.g., ion implantation. Thus, in the semiconductor substrate 10 in the PMOS transistor forming region 4, the N-type well 16N is formed. Then, the photoresist film is released by, e.g., ashing.

Next, by, e.g., thermal oxidation, the gate insulation film 18 is formed on the surface of the semiconductor substrate 10. The gate insulation film 18 is, e.g. silicon oxide film. The film thickness of the gate insulation film 18 is set at, e.g., 1.5 nm.

Then, on the entire surface, a polysilicon film is formed by, e.g., CVD (Chemical Vapor Deposition). The polysilicon film is to be the gate interconnect 20. The film thickness of the polysilicon film is set at, e.g., 100 nm.

Then, on the entire surface, a photoresist film (not illustrated) is formed by, e.g., spin coating.

Next, by photolithography, the photoresist film is patterned in the plane shape of the gate interconnect 20.

Next, with the photoresist film as the mask, the polysilicon film is etched. Thus, the gate interconnect 20 of polysilicon film is formed continuously in the NMOS transistor forming region 2 and the PMOS transistor forming region 4.

The gate interconnect 20 is formed wider in the region near the boundary between the NMOS transistor forming region 2 and the PMOS transistor forming region 4 (see FIG. 2). That is, the width of the gate interconnect 20 at the border between the NMOS transistor forming region 2 and the PMOS transistor forming region 4 is set larger than the width of the gate interconnect 20 in the devices regions 12a, 12b. The width of the gate interconnect 20 is so set that the contact hole 46a is formed down to such wider part. Then, the photoresist film is removed by, e.g., ashing.

Next, on the entire surface, a photoresist film (not illustrated) is formed by, e.g., spin coating.

Next, by photolithography, a photoresist film having an opening exposing the NMOS transistor forming region 2 is formed.

Next, with the photoresist film and the gate interconnect 20 as the mask, an N-type dopant impurity is implanted into the semiconductor substrate 10 by, e.g., ion implantation. Thus, the lightly doped N-type impurity regions (extension regions) 24a are formed in the semiconductor substrate 10 on both sides of the gate interconnect 20 in the NMOS transistor forming region 2. Then, the photoresist film is removed by, e.g., ashing.

Next, on the entire surface, a photoresist film (not illustrated) is formed by, e.g., spin coating.

Next, by photolithography, a photoresist film having an opening (not illustrated) exposing the PMOS transistor forming region 4 is formed.

Next, with the photoresist film and the gate interconnect 20 as the mask, a P-type dopant impurity is implanted into the semiconductor substrate 10 by, e.g., ion implantation. Thus, the lightly doped P-type impurity regions (extension regions) 28a are formed in the semiconductor substrate 10 on both sides of the gate interconnect 20 in the PMOS transistors forming region 4. Then, the photoresist film is removed by, e.g., ashing.

Next, on the entire surface, an insulation film is formed by, e.g., CVD. The insulation film is to be the sidewall insulation film. Such insulation film is, e.g., silicon oxide film. The film thickness of the insulation film is set at, e.g., 30 nm.

Next, the insulation film is etched by, e.g., anisotropic etching. Thus, the sidewall insulation film 22 is formed on the side walls of the gate interconnect 20.

Then, on the entire surface, a photoresist film (not illustrated) is formed by, e.g., spin coating.

Then, by photolithography, a photoresist film having an opening (not illustrated) exposing the NMOS transistor forming region 2 is formed.

Next, with the photoresist film, the gate interconnect 20 and the sidewall insulation film 22 as the mask, an N-type dopant impurity is implanted into the semiconductor substrate 10 by, e.g., ion implantation. Thus, heavily doped N-type impurity regions 24b are formed in the semiconductor substrate 10 on both sides of the gate interconnect 20 in the NMOS transistor forming region 2. Thus, the source/drain diffusion layers 26 of the extension source/drain structure are formed by the lightly doped impurity regions (extension regions) 24a and the heavily doped impurity regions 24b.

When the N-type dopant impurity for to form the source/drain diffusion region layers 26 is implanted, the N-type dopant impurity is implanted also into the gate interconnect 20 in the NMOS transistor forming region 2. Thus, the part of the gate interconnect 20 in the NMOS transistor forming region 2 becomes the gate electrode 20a with the N-type dopant impurity implanted in. Then, the photoresist film is removed by, e.g., ashing.

Then, on the entire surface, a photoresist film (not illustrated) is formed by, e.g., spin coating.

Then, by photolithography, a photoresist film having an opening (not illustrated) exposing the PMOS transistor forming region 4 is formed.

Next, with the photoresist film, the gate interconnect 20 and the sidewall insulation film 22 as the mask, a P-type dopant impurity is implanted into the semiconductor substrate 10 by, e.g., ion implantation. Thus, heavily doped P-type impurity regions 28b are formed in the semiconductor substrate 10 on both sides of the gate interconnect 20 in the PMOS transistor forming region 4. Thus, the source/drain diffusion layers 30 of the extension source/drain structure are formed by the lightly doped impurity regions (extension regions) 28a and the heavily doped impurity regions 28b.

When the P-type dopant impurity for forming the source/drain diffusion layers 30 is implanted, the P-type dopant impurity is implanted also into the gate interconnect 20 in the PMOS transistor forming region 4. Thus, the part of the gate interconnect 20 in the PMOS transistor forming region 4 becomes the gate electrode 20b with the P-type dopant impurity implanted in. The boundary between the gate electrode 20a of the NMOS transistor 34 and the gate electrode 20b of the NMOS transistor 36 agrees with the boundary between the NMOS transistor forming region 2 and the PMOS transistor forming region 4. Then, the photoresist film is removed by, e.g. ashing.

Next, on the entire surface, a refractory metal film is formed. As the refractory metal film, nickel film, cobalt film or others, for example, is formed. The film thickness of the refractory metal film is, e.g., about 10 nm.

Next, thermal processing is made to react the silicon atoms in the semiconductor substrate 10 and the metal atoms of the refractory metal film with each other. The silicon atoms in the gate interconnect 20 and the metal atoms in the refractory film are reacted with each other. The thermal processing temperature is set at, e.g., about 200-300° C.

Next, the unreacted part of the refractory metal film is etched off.

Thus, a silicide film 32 is formed respectively on the source/drain diffusion layers 26, 30. The silicide layer 32 formed on the source/drain diffusion layers 26, 30 functions as the source/drain electrodes. The silicide film 32 is formed also on the gate interconnect 20.

Thus, in the NMOS transistor forming region 2, the NMOS transistor 34 including the gate electrode 20a, the source/drain diffusion layers 26, etc. is formed. In the PMOS transistor forming region 4, the PMOS transistor 36 including the gate electrode 20b and the source/drain diffusion layers 30, etc. is formed.

Next, on the entire surface, the tensile stress film (first stress film) 38 is formed by, e.g., plasma CVD (see FIG. 3B). The tensile stress film 38 applies tensile stresses to the channel region of the NMOS transistor 34 to improve the carrier mobility.

The tensile stress film 38 can be formed as exemplified below.

That is, the tensile tress film 38 is formed, e.g., with a parallel plate type plasma enhanced CVD system and in a vacuum chamber. The substrate temperature for forming the tensile stress film 38 is set at, e.g., about 400° C. In the vacuum chamber, $N_2$ gas, $NH_3$ gas and $SiH_4$ gas, for example, are concurrently supplied. The flow rate of the $N_2$ gas is, set at, e.g., 500-3000 sccm. The flow rate of the $NH_3$ gas is set at, e.g., 100-1000 sccm. The flow rate of the $SiH_4$ gas is set at, e.g., 200-500 sccm. The pressure in the chamber is set at, e.g., 1-10 Torr. The frequency of the high frequency power to be applied is set at, e.g., 13.56 MHz. The wattage of the high frequency power is set at, e.g., about 100-500 W. The film forming period of time of the tensile tress film 38, i.e., excitation period of time of the plasmas is set at, e.g., about 10-100 seconds. Thus, a silicon nitride film is formed on the entire surface. Then, UV rays are applied to the silicon nitride film with a UV radiation system. As the light source of the UV rays, a broadband UV ray source is used. The atmosphere for the UV radiation is set at, e.g., He atmosphere. The radiation period of time of the UV rays is set at, e.g., about 180-600 seconds.

Thus, the tensile stress film 38 of silicon nitride film is formed. Preferably, the film thickness of the tensile stress film 38 is set within a range of, e.g., 30-100 nm. The film thickness of the tensile stress film 38 is set at, e.g., about 80 nm here.

The UV radiation to the tensile stress film 38 decreases the film density of the tensile stress film 38. The decrease of the film density of the tensile stress film 38 will be one factor for the low hydrofluoric acid resistance of the tensile stress film 38.

The content ratio of carbon of the tensile stress film 38 is lower than the content ratio of the carbon of the compressive stress film. The lower carbon content ratio of the tensile stress film 38 will be also one factor for the low hydrofluoric acid resistance of the tensile stress film 38.

Then, on the entire surface, the first etching stopper insulation film 39 is formed by, e.g., plasma-enhanced CVD (see FIG. 4A). The first etching stopper film 39 functions as the etching stopper in etching the second etching stopper film 40 to be formed in a later step. Accordingly, the etching characteristics of the first etching stopper film 39 are different from the etching characteristics of the second etching stopper film 40. The second etching stopper film 40, whose resistance to the hydrofluoric acid, etc. contained in the etchant is relatively low, is etched with the etchant, but the first etching stopper film 39, whose resistance to the hydrofluoric acid, etc., is relatively high, is not substantially etched. The tensile stress film 38, whose resistance to the hydrofluoric acid, etc. is relatively low, is never etched because of the first etching stopper film 39, whose resistance to the hydrofluoric acid, etc. is relatively high, formed on the tensile stress film 38, and is protected by the first etching stopper film 39. Thus, it is preferable that the first etching stopper film 39 has higher resistance to the hydrofluoric acid, etc. in the etchant than the tensile stress film 38. On the other hand, when the contact hole 46a is formed at a later step, it is preferable that the first etching stopper film 39 does not prevent the etching. Accordingly, the first etching stopper film 39 can be the same film as the compressive stress film 42, for example, to be formed at a later step. The compressive stress film 42 has higher resistance to the hydrofluoric acid, etc, contained in the etchant than the tensile stress film. When the same film as the compressive stress film 42 is used as the first etching stopper film 39, in forming the contact hole 46a, the first etching stopper film 39 can be etched together with the compressive stress film 42 without preventing the etching.

When the same film as the compressive stress film 42 is used as the first etching stopper film 39, the first etching stopper film 39 can be formed as exemplified below. That is, the first etching stopper film 39 is formed, e.g., with a parallel plate type plasma-enhanced CVD system and in a vacuum chamber. The substrate temperature for forming the first etching stopper film 39 is set at, e.g., about 400° C. Into the vacuum chamber, $N_2$ gas, $H_2$ gas, $NH_3$ gas, $SiH_4$ gas and $(CH_3)_3SiH$ gas (trimethylsilane gas), for example, are concurrently supplied. The flow rate of the $N_2$ gas is set at, e.g., 500-3000 sccm. The flow rate of the $H_2$ gas is set at, e.g., 500-3000 sccm. The flow rate of the $NH_3$ gas is set at, e.g., 100-1000 sccm. The flow rate of the $SiH_4$ gas is set at, e.g., 200-500 sccm. The flow rate of the $(CH_3)_3SiH$ gas is set at, e.g., 50-150 sccm. The pressure in the chamber is set at, e.g. 1-10 Torr. The frequency of the high frequency power to be applied is set at, e.g., 13.56 MHz. The wattage of the high frequency power to be applied is set at, e.g., about 100-500 W. The film forming period of time of the first etching stopper film 39, i.e., the excitation period of time of the plasmas is set at, e.g., about 10-100 seconds. Thus, the first etching stopper film 39 of silicon nitride film is formed. Preferably, the film thickness of the first etching stopper film 39 is set within a range of, e.g., 10-50 nm. The film thickness of the first etching stopper film 39 is set at, e.g., about 30 nm here.

The first etching stopper film 39 finally remains on the tensile stress film 38. Accordingly, when the film thickness of the first etching stopper film 39, which is the compressive stress film, is increased, the tensile stresses to be applied by the tensile stress film 38 to the channel region of the NMOS transistor 34 are mitigated by the etching stopper film 39. Then, sufficient tensile stresses cannot be applied to the channel region of the NMOS transistor 34. Accordingly, it is preferable that the film thickness of the first etching stopper film 39 is smaller than the film thickness of the tensile stress film 38. More preferably, the film thickness of the first etching stopper film 39 is set at ½ or below of the film thickness of the tensile stress film 38.

The first etching stopper film 39, to which UV rays have not been applied, has higher film density than the film density of the compressive stress film. This will be one factor for the higher hydrofluoric acid resistance of the first etching stopper film 39 than the hydrofluoric acid resistance of the tensile stress film 38.

The first etching stopper film 39, which has been formed of a raw material gas containing carbon, has a higher carbon content ratio than the tensile stress film 38. The relatively higher carbon content ratio of the first etching stopper film 39 will be one factor for the high hydrofluoric acid resistance of the first etching stopper film 39.

Then, the second etching stopper insulation film 40 is formed on the entire surface by, e.g., plasma CVD. The second etching stopper film 40 functions as the etching stopper in etching the compressive stress film (second stress film) 42 at a later step. Accordingly, the etching characteristics of the second etching stopper film 40 are different from the etching characteristics of the compressive stress film 42 to be formed at a later step. The etching characteristics of the second etching stopper film 40 are different also from the etching characteristics of the first etching stopper film 39. As the second etching stopper film 40, silicon oxide film, for example, is formed. The second etching stopper film 40 is formed by using TEOS (tetraethoxysilane) or others. Preferably, the film thickness of the second etching stopper film 40 is set within a range of, e.g., 10-50 nm. The film thickness of the second etching stopper film 40 is set at, e.g., about 30 nm.

Next, a photoresist film 60 is formed on the entire surface by, e.g., spin coating.

Then, the photoresist film 60 is patterned by photolithography (see FIG. 4B). Thus, the photoresist film 60 covering the NMOS transistor forming region 2 and exposing the PMOS transistor forming region 4 is formed. The end face of the photoresist film 60 on the side of the PMOS transistor forming region 4 agrees with the boundary between the NMOS transistor forming region 2 and the PMOS transistor forming region 4.

Then, with the photoresist film 60 as the mask, the second etching stopper film 40 is isotropically etched with the first etching stopper film 39 as the etching stopper (see FIG. 5A). By the etching which is isotropic, not only the part of the second etching stopper film 40 exposed out of the photoresist film 60 but also a part of the part of the second etching stopper film 40 covered by the photoresist film 60 are etched. That is, a part of the second etching stopper film 40 in the NMOS transistor forming region 2, which is near the PMOS transistor forming region 4 is etched in the direction parallel with the surface of the semiconductor substrate 10 (side-etching). In other words, the second etching stopper film 40 located below the photoresist film 60 is etched by a prescribed width X from the end of the photoresist film 60 in the direction parallel with the surface of the semiconductor substrate 10.

When the second etching stopper film 40 is isotropically etched, e.g., wet etching can be used. As the etchant, an etchant containing, e.g., hydrofluoric acid and ammonium fluoride is used. The concentration of the hydrofluoric acid of the etchant is set at, e.g., about 0.5 wt %. The concentration of the ammonium fluoride of the etchant is set at, e.g., about 20 wt %.

The etchant is not limited to the etchant containing hydrofluoric acid and ammonium fluoride. However, it is preferable to use as an etchant which makes the etching rate for the second etching stopper film 40 higher than the etching rate for the first etching stopper film 39. This is because when the first etching stopper film 39 is excessively etched in etching the second etching stopper film 40, and the tensile stress film 38 becomes excessively thin, sufficient stresses cannot be applied to the channel region of the NMOS transistor 34.

When the etchant described above is used, the etching rate of the second etching stopper film 40 to the tensile stress film 38 is, e.g., about 0.9 times. Accordingly, unless the first etching stopper film 39 is provided on the tensile stress film 38, in side-etching the second etching stopper film 40, the tensile stress film 38 is excessively etched. On the other hand, when the etchant described above is used, the etching rate of the second etching stopper film 40 to the first etching stopper film 39 is, e.g., about 3 times. In the present embodiment, because of the first etching stopper film formed on the tensile stress film 38, the second etching stopper film 40 can be surely side-etched while the tensile stress film 38 is prevented from being etched.

The second etching stopper film 40 may be isotropically etched by, e.g., chemical dry etching. That is, the second etching stopper film 40 may be isotropically etched, e.g., with a remote plasma type dry etching system by exciting the etching gas and generating radicals and applying the radicals to the semiconductor substrate. In this case as well, it is preferable that the etching gas, etc. are so set that the etching rate for the second stopper film 40 is sufficiently higher than for the first etching stopper film 39.

The side-etching quantity X, i.e., the distance X between the end face of the second etching stopper film 40 on the side of the PMOS transistor forming region 4 and the boundary between the NMOS transistor forming region 2 and the PMOS transistor forming region 4 is set in consideration of the following point.

That is, when the distance X is too small, in forming the contact hole 46a by etching in a later step, the second etching stopper film 40 prevents the etching. To prevent the etching from being stopped by the second etching stopper film 40, it is preferable to space from the contact hole 46a the position of the end face of the second etching stopper film 40 on the side of the PMOS transistor forming region 4. Specifically, it is preferable that the distance X is set larger than the radius (D/2) of the contact hole 46a.

In patterning the photoresist film 60, in patterning the photoresist film 64 for forming the contact hole 46a in a later step, etc., alignment errors in the photolithography may occur. In order to prevent the etching from prevented by the second etching stopper film 40 in the forming of the contact hole 46a, it is more preferable to consider alignment errors in the photolithography. Accordingly, when a maximum value of the alignment errors in the photolithography is P, and a radius of the contact hole 46a is D/2, more preferably, the side-etching quantity X is set to satisfy the following Formula 1.

$$(D/2)+P<X \tag{1}$$

By setting the radius of the contact hole 46a and the side-etching quantity X to satisfy Formula 1 described above, it is more surely possible to prevent from being stopped by the second etching stopper film 40 in forming the contact hole 46a.

To satisfy Formula 1 described above is not essential to produce the advantageous effects of the present embodiment. For example, even when D/2>X in FIG. 9A, the second etching stopper film 40 is laterally etched, whereby the effect of suppressing the decrease of the opening areas of the contact holes can be produced.

Thus, the second etching stopper film 40 remains in the part of the NMOS transistor forming region 2 except the part near the PMOS transistor forming region 4. That is, the end face of the second etching stopper film 40 on the side of the PMOS transistor forming region 4 is spaced from the boundary between the NMOS transistor forming region 2 and the PMOS transistor forming region 4. The distance X between the end face of the second etching stopper film 40 on the side of the PMOS transistor forming region 4, and the boundary between the NMOS transistor forming region 2 and the PMOS transistor forming region 4 is set at, e.g., about 60 nm.

Then, with the photoresist film 60 as the mask, the first etching stopper film 39 and the tensile stress film 38 are anisotropically etched (see FIG. 5B). The anisotropic etching is made, e.g., with a parallel plate type dry etching system and in a vacuum chamber. The substrate temperature for the etching is set at, e.g., about 25° C. The etching gas to be supplied into the vacuum chamber can be a mixture of arbitrary ones of, e.g., $C_4F_8$ gas, $C_4F_6$ gas, $CF_4$ gas, $CHF_3$ gas, $CH_2F_2$ gas, $CH_3F$ gas, $O_2$ gas, CO gas and Ar gas. For example, as the etching gas, the mixed gas of $C_4F_8$ gas, $O_2$ gas and Ar gas can be used. In this case, the flow rate ratio of the $C_4F_8$ gas, the $O_2$ gas and the Ar gas is set at, e.g., (1-20):(1-20):(300-1000). The total flow rate of the $C_4F_8$ gas, the $O_2$ gas and the Ar gas is set within a range of, e.g., 300-1000 sccm. The pressure in the chamber is set at, e.g., 10-300 mTorr. The frequency of the high frequency power to be applied is set at, e.g. 13.56 MHz. The wattage of the high frequency power to be applied is set at, e.g. about 100-1000 W. During the etching, the etching gas may be replaced by another mixed gas of another combination, e.g., the mixed gas of, e.g., $CH_3F$ gas, $O_2$ gas and Ar gas. In this case, the flow rate ratio among the $CH_3F$ gas, the $O_2$ gas and the Ar gas is set at, e.g., (5-100):(1-300):(0-1000). The total flow rate of the mixed gas of $CH_3F$ gas, $O_2$ gas and Ar gas is set at a range of, e.g., 300-1000 sccm.

Then, the pohotoresist film 60 is removed by, e.g., ashing (see FIG. 6A).

Next, on the entire surface, the compressive stress film (second stress film) 42 is formed by, e.g., plasma-enhanced CVD (see FIG. 6B). The compressive stress film 42 applies compressive stresses to the channel region of the PMOS transistor 36 to thereby improve the carrier mobility.

The compressive stress film 42 can be formed as exemplified below. That is, the compressive stress film 42 is formed, e.g., with a parallel plate type plasma-enhanced CVD system and in a vacuum chamber. The substrate temperature for forming the compressive stress film 42 is set at, e.g. about 400° C. Into the vacuum chamber, $N_2$ gas, $H_2$ gas, $NH_3$ gas, $SiH_4$ gas and $(CH_3)_3SiH$ gas (trimethylsilane gas), for example, are simultaneously supplied. The flow rate of the $N_2$ gas is set at, e.g., 500-3000 sccm. The flow rate of the $H_2$ gas is set at, e.g. 500-3000 sccm. The flow rate of the $NH_3$ gas is set at, e.g., 100-1000 sccm. The flow rate of the $SiH_4$ gas is set at, e.g., 200-500 sccm. The flow rate of the $(CH_3)_3SiH$ gas is set at, e.g. 50-150 sccm. The pressure in the chamber is set at, e.g. 1-10 Torr. The frequency of the high frequency power to be applied is set at, e.g. 13.56 MHz. The wattage of the high frequency power to be applied is set at, e.g., about 100-500 W. The film forming period of time of the compressive stress film 42, i.e., excitation period of time of the plasma is set at, e.g., about 10-100 seconds. Thus, the compressive stress film 42 is formed of silicon nitride film. Preferably, the film thickness of the compressive stress film 42 is set within a range of, e.g., 30-100 nm. The film thickness of the compressive stress film 42 is set at, e.g., about 80 nm here. In the present embodiment, the compressive stress film 42 is formed after the tensile stress film 38 has been formed, whereby the compressive stress film 42 can be prevented from peeling.

Then, on the entire surface, a photoresist film 62 is formed by, e.g., spin coating.

Then, by photolithography, the photoresist film 62 is patterned (see FIG. 7A). The photoresist film 62 is formed, covering not only the PMOS transistor forming region 4 but also a part of the NMOS transistor forming region 2. Specifically, the photoresist film 62 is formed, covering the PMOS transistor forming region 4 and positioning the end face of the photoresist film 2 on the side of the NMOS transistor forming region 2 on the second etching stopper film 40.

The distance Y between the end face of the photoresist film 62 on the side of the NMOS transistor forming region 2, and the boundary between the NMOS transistor forming region 2 and the PMOS transistor forming region 4 is set, taking into consideration the following point.

That is, when the distance Y is too small, there is a risk that in etching the compressive stress film 42 in a later step with the second etching stopper film 40 as the etching stopper, even the first etching stopper film 39, the tensile stress film 38 and the silicide layer 32 in the region where the second etching stopper film 40 is absent might be etched. To prevent the etching of even the tensile stress film 38 and the silicide layer 32 in etching the compressive stress film 42, it is preferable that the end of the photoresist film 62 on the side of the NMOS transistor forming region 2 is located on the second etching stopper film 40. Specifically, it is preferable that the distance Y is set larger than the distance X.

In patterning the photoresist film 62, often alignment errors in the photolithography take place. To surely prevent even the tensile stress film 38 from being etched in etching the compressive stress film 42, it is more preferable to consider the alignment errors in the photolithography. For this, when the maximum value of the alignment errors in the photolithography is Q, it is preferable that the distance Y is set so as to satisfy Formula 2 described below.

$$Y-Q>X \quad (2)$$

By setting the distance X and the distance Y so as to satisfy Formula 2 described above, the etching of even the tensile stress film 38 and the silicide layer 32 in etching the compressive stress film 42 can be surely prevented.

Then, with the photoresist film 62 as the mask and with the second etching stopper film 40 as the etching stopper, the compressive stress film 42 is anisotropically etched (see FIG. 7B). The anisotropic etching is made, e.g., with a parallel plate type dry etching system and in a vacuum chamber. The substrate temperature for the etching is set at, e.g., about 25° C. As the etching gas to be supplied into the vacuum chamber, the mixture of an arbitrary combination, e.g., of $C_4F_8$ gas, $C_4F_6$ gas, $CF_4$ gas, $CHF_3$ gas, $CH_2F_2$ gas, $CH_3F$ gas, $O_2$ gas, CO gas and Ar gas can be used. For example, as the etching gas, the mixed gas of $C_4F_8$ gas, $O_2$ gas and Ar gas can be used. In this case, the flow rate ratio among the $C_4F_8$ gas, the $O_2$ gas and the Ar gas is set at, e.g., (1-20):(1-20):(300-1000). The total flow rate of the mixed gas of the $C_4F_8$ gas, the $O_2$ gas and the Ar gas is set within a range of, e.g., 300-1000 sccm. The pressure in the chamber is set at, e.g., 10-300 mTorr. The frequency of the high frequency power to be applied is set at, e.g. 13.56 MHz. The wattage of the high frequency power to be applied is set at, e.g., about 100-1000 W. During the etching, the etching gas may be replaced by the mixed gas of another combination, e.g., the mixed gas of, e.g., $CH_3F$ gas, $O_2$ gas and Ar gas. For example, the flow rate ratio among the $CH_3F$ gas, the $O_2$ gas and the Ar gas is set at, e.g., (5-100):(1-300):(0-1000). The total flow rate of the mixed gas of the $CH_3F$ gas, the $O_2$ gas and the Ar gas is set within a range of, e.g., 300-1000 sccm.

Then, the photoresist film 62 is removed by, e.g., ashing (see FIG. 8A). Thus, the compressive stress film 42 is formed with the end face on the side of the NMOS transistor forming region 2 located on the etching stopper film 40. That is, the compressive stress film 42 is formed with a part thereof overlapping a part of the tensile stress film 38 and a part of the second etching stopper film 40. The distance Y between the end face of the compressive stress film 42 on the side of the NMOS transistor forming region 2, and the boundary between the NMOS transistor forming region 2 and the PMOS transistor forming region 4 is set larger than the distance X. The distance Y between the end face of the compressive stress film 42 on the side of the NMOS transistor forming region 2, and the boundary between the NMOS transistor forming region 2 and the PMOS transistor forming region 4 is set at, e.g., about 80 nm.

Next, on the entire surface, the inter-layer insulation film 44 is formed by, e.g., CVD (see FIG. 8B). Preferably, the film thickness of the inter-layer insulation film 44 is set within a range of, e.g., 200-500 nm. The film thickness of the inter-layer insulation film 44 is set at, e.g., about 400 nm here. As the inter-layer insulation film 44, silicon oxide film or PSG (Phospho Silicate Glass) film, for example, is formed.

Next, the surface of the inter-layer insulation film 44 is planarized by, e.g., CMP (Chemical Mechanical Polishing).

Next, a photoresist film 64 is formed by, e.g., spin coating (see FIG. 9A).

Then, the openings 66a-66c are formed in the photoresist film 64 by photolithography. The opening 66a is for forming the contact hole 46a. The radius (D/2) of the opening 66 for forming the contact hole 46a is set smaller than the distance X. More preferably, the radius (D/2) of the opening 66 for forming the contact hole 46a is so set to satisfy Formula 1 described above. The opening 66a is formed with the center of the opening 66a located above the gate interconnect 20 in the boundary between the PMOS transistor forming region 2 and the NMOS transistor forming region 4. The openings 66b, 66c are respectively for forming the contact holes 46b, 46c. The openings 66b, 66c are formed, respectively located above the silicide layer 32. The diameter D of the openings 66a is set at, e.g., about 80 nm.

Next, with the photoresist film 64 as the mask, the inter-layer insulation film 44, the compressive stress film 42, the first etching stopper film 39 and the tensile stress film 38 are etched. The etching is made, e.g., with a parallel palate type dry etching system and in a vacuum chamber. The substrate temperature for the etching is set at, e.g., about 25° C. As the etching gas to be supplied into the vacuum chamber, $C_4F_8$ gas, $C_4F_6$ gas, $CF_4$ gas, $CHF_3$ gas, $CH_2F_2$ gas, $CH_3F$ gas, $O_2$ gas, CO gas and Ar gas can be mixed in an arbitrary combination.

Specifically, in etching the inter-layer insulation film 44, as the etching gas, the mixed gas of, e.g., $C_4F_6$ gas, $O_2$ gas and Ar gas can be used. In this case, the flow rate ratio among the $C_4F_6$ gas, the $O_2$ gas and the Ar gas is set at, e.g., (1-50):(1-50):(300-1000). The total flow rate of the $C_4F_6$ gas, the $O_2$ gas and the Ar gas is set within a range of, e.g., 300-1000 sccm. The pressure in the chamber is set at, e.g., 10-300 mTorr. The frequency of the high frequency power to be applied is set at, e.g., 13.56 MHz. The wattage of the high frequency power to be applied is set at, e.g., about 100-10000 W.

In etching the compressive stress film 42, the first etching stopper film 39 and the tensile stress film 38, the mixed gas of, e.g., $CH_3F$ gas, $O_2$ gas and Ar gas can be used. In this case, the flow rate ratio among the $CH_3F$ gas, the $O_2$ gas and the Ar gas is set at, e.g., (5-100):(1-300):(0-1000). The total flow rate of the mixed gas of the $CH_3F$ gas and the $O_2$ gas and the Ar gas is set within a range of, e.g., 300-1000 sccm. The pressure in the chamber is set at, e.g., 10-300 mTorr. The frequency of the high frequency power to be applied is set at, e.g., 13.56 MHz. The wattage of the high frequency power to be applied is set at, e.g., about 100-1000 W.

Thus, in the inter-layer insulation film 44, the compressive stress film 42, the first etching stopper film 39 and the tensile stress film 38, the contact hole 46a is formed down to the gate interconnect 20 at the border between the NMOS transistor forming region 2 and the PMOS transistor forming region 4. The contact hole 46a is passed through the inter-layer insulation film 44, the compressive stress film 42, the first etching stopper film 39 and the tensile stress film 38. The diameter D of the top of the contact hole 46a is set at, e.g., about 80 nm.

In the inter-layer insulation film 44, the second etching stopper film 40, the first etching stopper film 39 and the tensile stress film 38 in the NMOS transistor forming region 2, the contact holes 46b are formed down to the source/drain electrodes 32 of the NMOS transistor 34. In the inter-layer insulation film 44 and the compressive stress film 42 in the PMOS transistor forming region 4, the contact holes 46c are formed down to the source/drain electrodes 32 of the NMOS transistor 36.

The end face of the second etching stopper film 40 on the side of the PMOS transistor forming region 4 is spaced from the portion where the contact hole 46a is to be formed, and in forming the contact hole 46a, the second etching stopper film 40 never prevents the etching. Thus, according to the present embodiment, the contact hole 46a can be surely formed down to the gate interconnect 20 at the border between the NMOS transistor forming region 2 and the PMOS transistor forming region 4.

In the present embodiment, as the first etching stopper film 39, the same film as the compressive stress film 42 is used, and the first etching stopper film 39 and the compressive stress film 42 are the same in the etching characteristics for forming the contact hole 46a. On the other hand, the etching rate of the tensile stress film 38 and the etching rate of the compressive stress films 39, 42 for forming the contact hole 46a are a little different from each other. However, the difference between the etching rates of the tensile stress film 38 and the etching rate of the compressive stress films 39, 42 is negligibly small in comparison with the difference between the etching rate of the second etching stopper film 40 and the etching rate of the stress films 38, 39, 42. Thus, the etching rate of the tensile stress film 38 and the etching rate of the compressive stress films 39, 42 are a little different from each other, which never prevents the formation of the contact hole 46a and causes no problems.

Then, the photoresist film 64 is removed by, e.g., ashing.

Next, the barrier metal film 48 is formed on the entire surface by, e.g., sputtering. The barrier metal film 48 is formed by sequentially stacking, e.g., a Ti film (not illustrated) and a TiN film (not illustrated). The film thickness of the Ti film is set at, e.g., about 3-10 nm. The film thickness of the TiN film is set at, e.g. about 3-10 nm.

Then, on the entire surface, a conduction film is formed by, e.g. CVD. The conduction film is to be the electrically conductive plugs 50a-50c. As the conduction film, a tungsten film, for example, is formed. The film thickness of the conduction film is set at, e.g., about 50-400 nm.

Next, the conduction film and the barrier metal film 48 are polished by, e.g., CMP until the surface of the inter-layer insulation film 44 is exposed. Thus, the electrically conductive plugs 50a-50c are formed respectively in the contact holes 46a-46c with the barrier metal film 48 formed on (see FIG. 9B). The conductor plug 50a is connected to the gate interconnect 20 at the border between the NMOS transistor forming region 2 and the PMOS transistor forming region 4. The electrically conductive plugs 50b are connected to the source/drain electrodes 32 of the NMOS transistors 34. The electrically conductive plugs 50c are connected to the source/drain electrodes 32 of the PMOS transistor 36.

Figure 10:
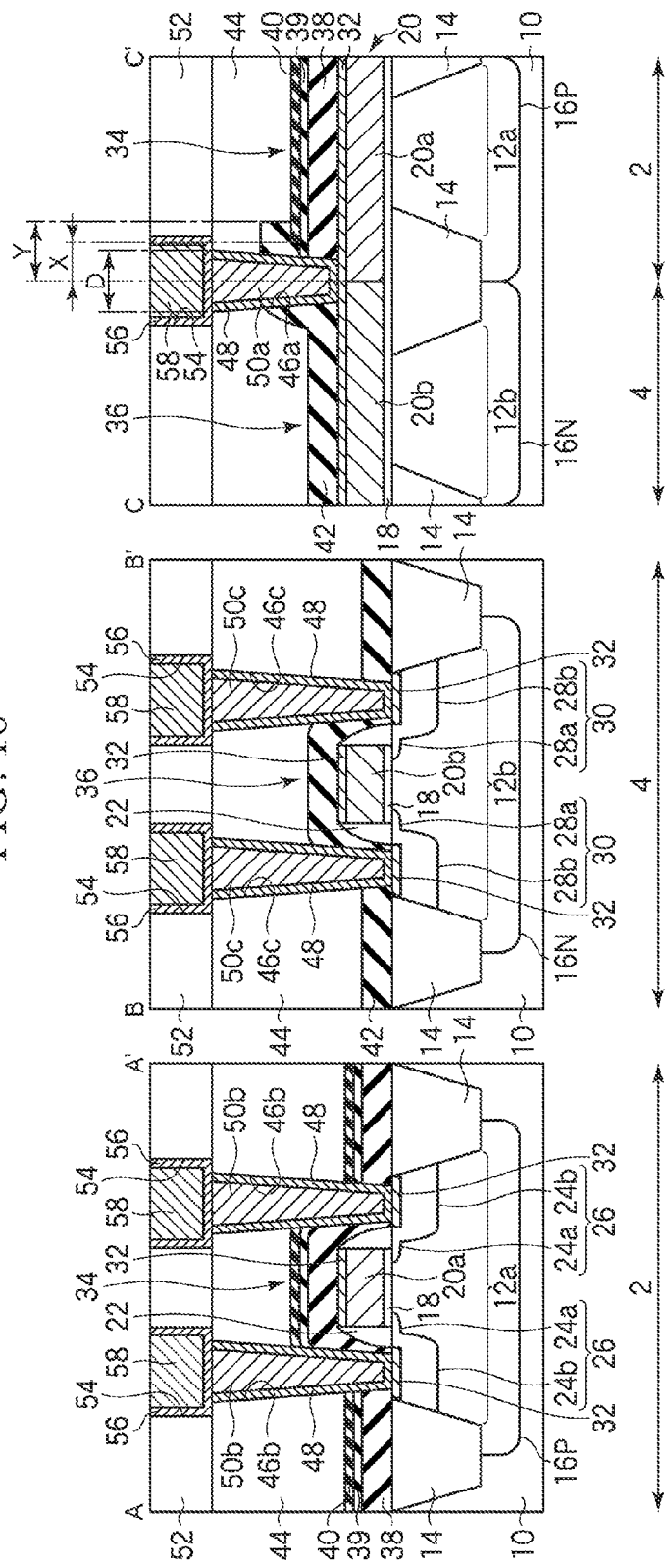

Then, the inter-layer insulation film 52 is formed on the entire surface by, e.g., CVD (see FIG. 10). As the inter-layer insulation film 52, a silicon oxide film, for example, is formed. The film thickness of the inter-layer insulation film 52 is set at, e.g., 100-200 nm.

Next, the trenches 54 for the interconnects 58 to be formed in are formed in the photoresist film 52 by photolithography. At the bottom surfaces of the trenches 54, the top surfaces of the electrically conductive plugs 50a-50c are exposed.

Next, on the entire surface, the barrier metal film 56 is formed by, e.g., sputtering. As the barrier metal film 56, a Ta film, for example, is formed.

Next, on the entire surface, a seed layer (not illustrated) is formed by, e.g., sputtering. The seed layer is used to form the conduction film well formed in a later step by electroplating. As the seed layer, a Cu film, for example, is formed. The film thickness of the seed layer is set at, e.g., about 1-10 nm.

Then, on the entire surface, the conduction film is formed by, e.g., electroplating. As the conduction film, a Cu film, for example, is formed. The film thickness of the conduction film is set at, e.g., 50-400 nm.

Next, the conduction film, the seed layer and the barrier metal film 56 are polished by, e.g., CMP until the surface of the inter-layer insulation film 52 is exposed. Thus, the interconnects 58 of the conduction film are formed in the trenches 54 with the barrier metal film 56 formed on.

Thus, the semiconductor device according to the present embodiment is manufactured.

As described above, according to the present embodiment, when the second etching stopper film 40 in the PMOS transistor forming region 4 is etched, a part of the second etching stopper film 40 in the NMOS transistor forming region 2 is also side-etched. Thus, according to the present embodiment when the contact hole 46a is formed down to the gate interconnect 20 at the border between the NMOS transistor forming region 2 and the PMOS transistor forming region 4, the etching is never prevented by the second etching stopper film 40. That is, when the contact hole 46a is formed by etching, the inter-layer insulation film 44, the compressive stress film 42, the first etching stopper film 39 and the tensile stress film 38 are etched without the etching being prevented by the second etching stopper film 40. Thus, according to the present embodiment, the good contact hole 46a can be formed, and the conductor plug 50a and the gate interconnect 20 can be surely connected to each other. Furthermore, according to the present embodiment, because of the first etching stopper film 39 formed on the tensile stress film 38, the tensile stress film 39 can be prevented from being etched in the side-etching of the second etching stopper film 40. Furthermore, the first etching stopper film 39 can be etched together with the compressive stress film 42 when the contact hole 46a is formed, the fist etching stopper film 39 never prevent the formation of the contact hole 46a. Furthermore according to the present embodiment, the compressive stress film 42 is formed after the tensile stress film 38 has been formed, whereby the compressive stress film 42 can be prevented from peeling. Thus, according to the present embodiment, the semiconductor device of high reliability can be manufactured with high manufacturing yields.

Modified Embodiments

The present invention is not limited to the above-described embodiment and can cover other various modifications.

For example, in the above-described embodiment, as the first etching stopper film 39, the same film as the compressive stress film 42 is used, but the first etching stopper film 39 is not limited to the same film as the compressive stress film 42. Since stresses and hydrofluoric acid resistance are not directly related with each other, the first etching stopper film 39 can be a film which generates only small stresses or no stress. In the above-described embodiment, as the first etching stopper film 39, silicon nitride film is used, but the first etching stopper film 39 is not limited to silicon nitride film. As the first etching stopper film 39, a film which can be the etching stopper in etching the second etching stopper film 40 can be suitably used. However, preferably, the fist etchings stopper film 39 is a film which can be etched together with the compressive stress film 42 and the tensile stress film 38 in forming the contact hole 46a. For example, as the first etching stopper film 39, SiCN film which is not a compressive stress film but a general film. In the case that SiCN film, which is general, is used as the first etching stopper film 39, the carbon concentration of such SiCN film can be set at, e.g., about 1-30%. Silicon nitride film, which contains carbon, has high hydrofluoric acid resistance, and the general SiCN film, which is not compressive stress film, has high hydrofluoric acid resistance, as is the compressive stress film. Thus, as the first etching stopper film 39, the general SiCN film, which is not compressive stress film, may be used. As the first etching stopper film 39, a film whose film density is higher than the tensile stress film 38 may be suitably used, because the film of high film density has higher hydrofluoric acid resistance in comparison with the film of low film density.

In the above-described embodiment, in forming the first etching stopper film 39 and the compressive stress film 42, as a raw material gas containing carbon, $(CH_3)_3SiH$ gas (trimethylsilane gas) is used, but the raw material gas containing carbon is not limited to this. In forming the first etching stopper film 39 and the compressive stress film 42, as the raw material gas containing carbon, $Si(CH_3)_4$ gas (tetramethylsilane gas) or others may be used.

In the above-described embodiment, as the tensile stress film 38, silicon nitride film is formed, but the tensile stress film 38 is not limited to silicon nitride film. A film which can apply stresses to the channel region of the transistor formed in the region 2 may be suitably used.

In the above-described embodiment, as the compressive stress film 42, silicon nitride film is formed, but the compressive stress film 42 is not limited to silicon nitride film. A film which can apply stresses to the channel region of the transistor formed in the region 4 may be suitably used.

In the above-described embodiment, as the second etching stopper film 40, silicon oxide film is formed, but the second etching stopper film 40 is not limited to silicon oxide film. A film whose etching characteristics are different from those of the compressive stress film 42 and are different from those of the first etching stopper film 39 may be suitably used as the second etching stopper film 40.

In the above-described embodiment, the gate electrodes 20a, 20b are formed by suitably implanting dopant impurities into the gate interconnects 20 formed of polysilicon film, but the material of the gate interconnects 20 is not limited to this. For example, the gate interconnects 20 may be formed of metal film.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A semiconductor device manufacturing method comprising:
   forming a gate interconnect both in a first region and a second region of a semiconductor substrate, forming in the first region a first transistor including a first gate electrode which is a part of the gate interconnect, and forming in the second region a second transistor including a second gate electrode which is another part of the gate interconnect;
   forming over the semiconductor substrate a first stress film so as to cover the first transistor and the second transistor;
   forming a first etching stopper film over the first stress film;
   forming over the first etching stopper film a second etching stopper film whose etching characteristic is different from an etching characteristic of the first etching stopper film;
   forming a first mask layer covering the first region and exposing the second region;
   removing the second etching stopper film in the second region with the first mask layer as a mask and the first etching stopper film as the stopper, and isotropically etching the second etching stopper film located below the first mask layer;
   etching off the first etching stopper film and the first stress film in the second region with the first mask layer as a mask;
   forming over the semiconductor substrate the second stress film whose etching characteristic is different from an etching characteristic of the second etching stopper film, covering the second transistor, the first stress film, the first etching stopper film and the second etching stopper film;
   forming over the second stress film a second mask layer covering the second region, an end face of the second mask layer on the side of the first region being located over the second etching stopper film;
   etching the second stress film with the second mask layer as the mask so that a part of the second stress film overlaps a part of the first stress film and a part of the second etching stopper film;
   forming over the semiconductor substrate an insulation film, covering the first stress film, the second stress film, the first etching stopper film and the second etching stopper film;
   forming a contact hole through the insulation film, the second stress film, the first etching stopper film and the first stress film down to the gate interconnect at a border between the first region and the second region; and
   forming an electrically conductive plug in the contact hole.

2. The semiconductor device manufacturing method according to claim 1, wherein
   in the isotropically etching the second etching stopper film located below the first mask layer, the etching is made with an etchant containing hydrofluoric acid.

3. The semiconductor device manufacturing method according to claim 1, wherein
   the first stress film is a silicon nitride film;
   the second etching stopper film is a silicon oxide film; and
   the first etching stopper film is a silicon nitride film whose carbon content ratio is higher than a carbon content ratio of the first stress film.

4. The semiconductor device manufacturing method according to claim 1, wherein
the first stress film is a silicon nitride film;
the second etching stopper film is a silicon oxide film; and
the first etching stopper film is a silicon nitride film whose film density is higher than a film density of the first stress film.

5. The semiconductor device manufacturing method according to claim 1, wherein
the second stress film is a silicon nitride film.

6. The semiconductor device manufacturing method according to claim 1, wherein
the first stress film is a tensile stress film; and
the first etching stopper film and the second stress film are compressive stress films.

7. The semiconductor device manufacturing method according to claim 1, wherein
a film thickness of the first etching stopper film is smaller than a film thickness of the first stress film.

8. The semiconductor device manufacturing method according to claim 7, wherein
the film thickness of the first etching stopper film is ½ or below of the film thickness of the first stress film.

9. The semiconductor device manufacturing method according to claim 1, wherein
the first transistor is an NMOS transistor; and
the second transistor is a PMOS transistor.

10. A semiconductor device comprising:
a gate interconnect formed both in a first region and a second region of a semiconductor substrate;
a first transistor formed in the first region and including a first gate electrode which is a part of the gate interconnect, and first source/drain diffusion layers formed in the semiconductor substrate on both sides of the first gate electrode;
a second transistor formed in the second region and including second gate electrode which is another part of the gate interconnect and second source/drain diffusion layers formed in the semiconductor substrate on both side of the second gate electrode;
a first stress film formed over the semiconductor substrate in the first region so as to cover the first transistor;
a first etching stopper film formed over the first stress film;
a second etching stopper film whose etching characteristic is different from an etching characteristic of the first etching stopper film and formed over the first region except a part thereof near the second region;
a second stress film formed over the semiconductor substrate in the second region so as to cover the second transistor, an edge of the second stress film on the side of the first region being overlapped with a part of the first stress film, a part of the first etching stopper film and a part of the second etching stopper film;
an insulation film formed over the semiconductor substrate so as to cover the first stress film, the first etching stopper film, the second etching stopper film and the second stress film; and
an electrically conductive plug buried in a contact hole formed through the insulation film, the second stress film, the first etching stopper film and the first stress film down to the gate interconnect at a border between the first region and the second region,
the end face of the second etching stopper film on the side of the second region receding from the end face of the first stress film on the side of the second region.

11. The semiconductor device according to claim 10, wherein
the first stress film is a silicon nitride film;
the second etching stopper film is a silicon oxide film; and
the first etching stopper film is a silicon nitride film whose carbon content ratio is higher than a carbon content ratio of the first stress film.

12. The semiconductor device according to claim 10, wherein
the first stress film is a silicon nitride film;
the second etching stopper film is a silicon oxide film; and
the first etching stopper film is a silicon nitride film whose film density is higher than a film density of the first stress film.

13. The semiconductor device according to claim 10, wherein
the second stress film is a silicon nitride film.

14. The semiconductor device according to claim 10, wherein
the first stress film is a tensile stress film; and
the first etching stopper film and the second stress film are compressive stress films.

15. The semiconductor device according to claim 10, wherein
a film thickness of the first etching stopper film is smaller than a film thickness of the first stress film.

16. The semiconductor device according to claim 15, wherein
the film thickness of the first etching stopper film is ½ or below of the film thickness of the first stress film.

17. The semiconductor device according to claim 10, wherein
the first transistor is an NMOS transistor; and
the second transistor is a PMOS transistor.

* * * * *